(12) United States Patent
Maeda et al.

(10) Patent No.: US 8,884,298 B2
(45) Date of Patent: Nov. 11, 2014

(54) SEMICONDUCTOR DEVICE HAVING EMBEDDED STRAIN-INDUCING PATTERN AND METHOD OF FORMING THE SAME

(71) Applicants: Shigenobu Maeda, Seongnam-si (KR); Hidenobu Fukutome, Seongnam-si (KR); Young-Gun Ko, Seongnam-si (KR); Joo-Hyun Jeong, Yongin-si (KR)

(72) Inventors: Shigenobu Maeda, Seongnam-si (KR); Hidenobu Fukutome, Seongnam-si (KR); Young-Gun Ko, Seongnam-si (KR); Joo-Hyun Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/826,633

(22) Filed: Mar. 14, 2013

(65) Prior Publication Data

US 2013/0341631 A1    Dec. 26, 2013

(30) Foreign Application Priority Data

Jun. 25, 2012 (KR) .................. 10-2012-0067999

(51) Int. Cl.
*H01L 29/10* (2006.01)
*H01L 29/04* (2006.01)
*H01L 29/78* (2006.01)

(52) U.S. Cl.
CPC ............ *H01L 29/045* (2013.01); *H01L 29/785* (2013.01); *H01L 29/7848* (2013.01)
USPC .............................. 257/66; 257/347; 438/301

(58) Field of Classification Search
CPC ...................................................... H01L 29/00
USPC .......................................... 257/347; 438/301
See application file for complete search history.

(56) References Cited

U.S. PATENT DOCUMENTS

| 7,355,253 | B2 | 4/2008 | Cohen |
| 7,384,830 | B2 | 6/2008 | Cohen |
| 7,525,160 | B2 | 4/2009 | Kavalieros et al. |
| 7,547,637 | B2 | 6/2009 | Brask et al. |
| 7,667,271 | B2 | 2/2010 | Yu et al. |
| 7,842,562 | B2 | 11/2010 | Cohen |
| 7,902,009 | B2 | 3/2011 | Simonelli et al. |
| 7,915,685 | B2 | 3/2011 | Cohen |
| 7,951,657 | B2 | 5/2011 | Cheng et al. |

(Continued)

FOREIGN PATENT DOCUMENTS

| JP | 2005-072582 | 3/2005 |
| JP | 2008-085357 | 4/2008 |
| JP | 2011-181931 | 9/2011 |
| JP | 2011-199287 | 10/2011 |

OTHER PUBLICATIONS

Maeda et al., *3 Dimensional Scaling Extensibility on Epitaxial Source Drain Strain Technology Toward Fin FET and Beyond*, 2013 Symposium on VLSI Technology Digest of Technical Papers, p. T88-T89 (2 pages).

*Primary Examiner* — Telly Green
(74) *Attorney, Agent, or Firm* — Myers Bigel Sibley & Sajovec, P.A.

(57) ABSTRACT

A semiconductor device can include an active region having a fin portion providing a channel region between opposing source and drain regions. A gate electrode can cross over the channel region between the opposing source and drain regions and first and second strain inducing structures can be on opposing sides of the gate electrode and can be configured to induce strain on the channel region, where each of the first and second strain inducing structures including a respective facing side having a pair of {111} crystallographically oriented facets.

30 Claims, 33 Drawing Sheets

(56) References Cited

U.S. PATENT DOCUMENTS

| | | |
|---|---|---|
| 7,994,062 B2 | 8/2011 | Wojtczak et al. |
| 8,049,286 B2 | 11/2011 | Tateshita |
| 8,071,442 B2 | 12/2011 | Kronholz et al. |
| 8,071,983 B2 | 12/2011 | Brask et al. |
| 8,138,552 B2 | 3/2012 | Matsuo |
| 8,298,011 B2 | 10/2012 | Tateshita |
| 2005/0263821 A1* | 12/2005 | Cho et al. .................. 257/347 |
| 2009/0283829 A1 | 11/2009 | Dyer et al. |
| 2011/0024804 A1 | 2/2011 | Chang et al. |
| 2011/0068407 A1 | 3/2011 | Yeh et al. |
| 2011/0204384 A1 | 8/2011 | Cheng et al. |
| 2011/0210393 A1 | 9/2011 | Chen et al. |
| 2011/0227162 A1 | 9/2011 | Lin et al. |
| 2012/0001254 A1 | 1/2012 | Kronholz et al. |
| 2012/0032237 A1 | 2/2012 | Brask et al. |
| 2012/0032265 A1 | 2/2012 | Simonelli et al. |
| 2012/0074468 A1 | 3/2012 | Yeh et al. |
| 2013/0075818 A1* | 3/2013 | Lee et al. .................. 257/347 |

* cited by examiner

SEMICONDUCTOR DEVICE HAVING EMBEDDED STRAIN-INDUCING PATTERN AND METHOD OF FORMING THE SAME

CROSS-REFERENCE TO RELATED APPLICATION

This application claims priority under 35 U.S.C. §119 to Korean Patent Application No. 10-2012-67999 filed on Jun. 25, 2012, the disclosure of which is hereby incorporated by reference in its entirety.

FIELD

Embodiments of the inventive concept relate to a multi-gate semiconductor device having a strain-inducing pattern embedded in a substrate and a method of forming the same.

BACKGROUND

In order to improve electrical characteristics of a semiconductor device, such as carrier mobility, various strain technologies have been studied to apply stress to a channel region. For example, one conventional approach forms a trench in an active region adjacent to a gate structure and a SiGe layer is formed in the trench. This approach, however, may cause several problems when applied to a multi-gate semiconductor device, such as a fin-shaped semiconductor device.

SUMMARY

Embodiments of the inventive concept provide a multi-gate semiconductor device having a strain-inducing pattern and methods of fabricating a multi-gate semiconductor device having a strain-inducing pattern.

In some embodiments according to the inventive concept, a semiconductor device can include an active region formed in a substrate and having an upper surface, a first side surface, a second side surface opposite the first side surface, a third side surface in contact with the first and second side surfaces, and includes a gate electrode covering at least one of the upper surface, the first side surface, and the second side surface, and a strain-inducing pattern in contact with the third side surface of the active region. The third surface of the active region includes two or more planes. A first plane of the third side surface forms an acute angle with respect to the first side surface, and a second plane of the third side surface forms an acute angle with respect to the second side surface.

In some embodiments, each of the first and second planes of the active region may be perpendicular to the upper surface.

In some embodiments, a first edge at which the first and second planes of the active region meet may be perpendicular to the upper surface.

In some other embodiments, the first edge may be overlapped by the gate electrode.

In some other embodiments, the upper surface of the active region may have {110} surface. Each of the first and second side surfaces may have {100} surface. Each of the first and second planes may have {111} surface.

In some embodiments, the third side surface of the active region may include a third plane in contact with upper ends of the first and second planes and in contact with the upper surface. The third plane may form an acute angle with respect to the upper surface. The third plane may have {111} surface.

An interface between the active region and the strain-inducing pattern may have a trapezoidal shape in a cross-sectional view.

In some embodiments, the first and second planes of the active region may have a V-shape in a top view.

In some embodiments, the third side surface of the active region may include a third plane in contact with upper ends of the first and second planes and in contact with the upper surface, and a fourth plane in contact with lower ends of the first and second planes. The third plane may form an acute angle with respect to the upper surface. Each of the upper surface, first side surface, and second side surface of the active region may have {110} surface. Each of the first plane, the second plane, the third plane, and the fourth plane may have {111} surface. The first plane, the second plane, the third plane, and the fourth plane may meet at a first corner point.

In some embodiments, the first plane, second plane, and third plane of the active region may meet to form a second corner point. The first plane and the second plane may meet to form a second edge. The first plane, the second plane, and the fourth plane may meet to form a third corner point. The second corner point, the second edge, and the third corner point may be aligned perpendicular to the upper surface of the active region.

In some embodiments, the first plane, third plane, and fourth plane of the active region may meet to form a fourth corner point. The third plane and the fourth plane may meet to form a third edge. The second plane, the third plane, and the fourth plane may meet to form a fifth corner point. The fourth corner point, the third edge, and the fifth corner point may be aligned parallel to the upper surface of the active region.

In some embodiments, the third side surface of the active region may include a fifth plane in contact with the first side surface and in contact with a lower end of the first plane, and a sixth plane in contact with the second side surface and in contact with a lower end of the second plane. The first plane may be in contact with the first side surface and the upper surface, and form an acute angle with respect to each of the first side surface and the upper surface. The second plane may be in contact with the second side surface and the upper surface, and form an acute angle with respect to each of the second side surface and the upper surface. The fifth plane may form an acute angle with respect to the first side surface, and the sixth plane may form an acute angle with respect to the second side surface. The first plane, the second plane, the fifth plane, and the sixth plane may meet to form a sixth corner point. Each of the upper surface, first side surface, and second side surface of the active region may have {100} surface. Each of the first plane, the second plane, the fifth plane, and the sixth plane may have {111} surface.

In some embodiments, the gate electrode may cover the first and second side surfaces of the active region.

In some embodiments according to the inventive concept, a semiconductor device includes a pair of strain-inducing patterns formed in a substrate, an active region formed between the pair of strain-inducing patterns and having a first side surface and a second side surface opposite the first side surface, and a gate electrode crossing the active region and covering the first and second side surfaces. Each of interfaces between the active region and the pair of strain-inducing patterns includes two or more planes. A first plane among the planes forms an acute angle with respect to the first side surface, and a second plane among the planes forms an acute angel with respect to the second side surface.

In some embodiments, an insulating pattern may be formed between an upper surface of the active region and the gate electrode. A gate dielectric layer may be formed between the active region and the gate electrode.

In some embodiments of the inventive concept, a semiconductor device is provided. The semiconductor device includes a pair of strain-inducing patterns formed in a substrate, an active region formed between the pair of strain-inducing patterns and having an upper surface, a first side surface, and a second side surface opposite the first side surface, and a gate electrode crossing the active region. Each of interfaces between the active region and the pair of strain-inducing patterns has {111} surface formed by a directional etching process. Each of the first and second side surfaces has {211} surface, the upper surface has {110} surface, and each of the interfaces is perpendicular to the upper surface.

In some embodiments, each of the interfaces may be perpendicular to the first side surface and the second side surface.

In some embodiments of the inventive concept, a method of forming a semiconductor device is provided. The method includes forming an active region having an upper surface, a first side surface, a second side surface opposite the first side surface, and a third side surface in contact with the upper surface and the first and second side surfaces in a substrate, forming a gate electrode covering at least one of the upper surface, the first side surface, and the second side surface, forming a strain-inducing pattern in contact with the third side surface of the active region. The third side surface of the active region includes two or more planes; A first plane of the third side surface forms an acute angle with respect to the first side surface, and a second plane of the third side surface forms an acute angle with respect to the second side surface.

In some embodiments, the formation of the strain-inducing pattern may include forming a first trench in the active region, forming a second trench by etching the active region exposed in the first trench using a directional etching process, and forming the strain-inducing pattern in the first and second trenches.

In some embodiments, the directional etching process may include using NH4OH, NH3OH, Tetra Methyl Ammonium Hydroxide (TMAH), KOH, NaOH, benzyl trimethyl ammonium hydroxide (BTMH), or a combination thereof.

In some embodiments, the strain-inducing pattern may include SiGe formed using a selective epitaxial growth (SEG) technology.

In some embodiments according to the inventive concept, a semiconductor device, can include an active region having a fin portion providing a channel region between opposing source and drain regions. A gate electrode can cross over the channel region between the opposing source and drain regions and first and second strain inducing structures can be on opposing sides of the gate electrode and can be configured to induce strain on the channel region, where each of the first and second strain inducing structures including a respective facing side having a pair of {111} crystallographically oriented facets.

In some embodiments according to the inventive concept, each pair of the facets is directly adjacent to opposing side surfaces of the respective strain inducing structure. In some embodiments according to the inventive concept, the pair of facets define respective obtuse angles relative to the opposing side surfaces of the respective strain inducing structure.

In some embodiments according to the inventive concept, each of the facets obliquely faces opposing interior side walls of the gate electrode crossing over the channel region. In some embodiments according to the inventive concept, the device can further include an oxide layer formed on the opposing interior side walls of the gate electrode crossing over the channel region and an insulating layer on an upper interior side wall of the gate electrode crossing over the channel region.

In some embodiments according to the inventive concept, the pair of {111} crystallographically oriented facets can include a first pair of facets, wherein the strain inducing structures each include a second pair of facets on a lower surface of the strain inducing structures, where each of the second pair of the facets is directly adjacent to the opposing side surfaces of the respective strain inducing structure and directly adjacent to lower surfaces of the respective strain inducing structures.

In some embodiments according to the inventive concept, the device can further include a third pair of facets on an upper surface of the strain inducing structures, where each of the third pair of the facets is directly adjacent to the opposing side surfaces of the respective strain inducing structure and to upper surfaces of the respective strain inducing structures. In some embodiments according to the inventive concept, at least a portion of each of the strain inducing structures extend beneath the gate electrode.

In some embodiments according to the inventive concept, the pairs of {111} crystallographically oriented facets are included in a pyramid tip shaped surface of the first and second strain inducing structures. In some embodiments according to the inventive concept, the pyramid tip shaped surface includes a crest line. In some embodiments according to the inventive concept, the pairs of {111} crystallographically oriented facets are included in a Chrysler building tip shaped surface of the first and second strain inducing structures each including 4 directly adjoining facets.

DETAILED DESCRIPTION OF THE EMBODIMENTS

Figure 1:
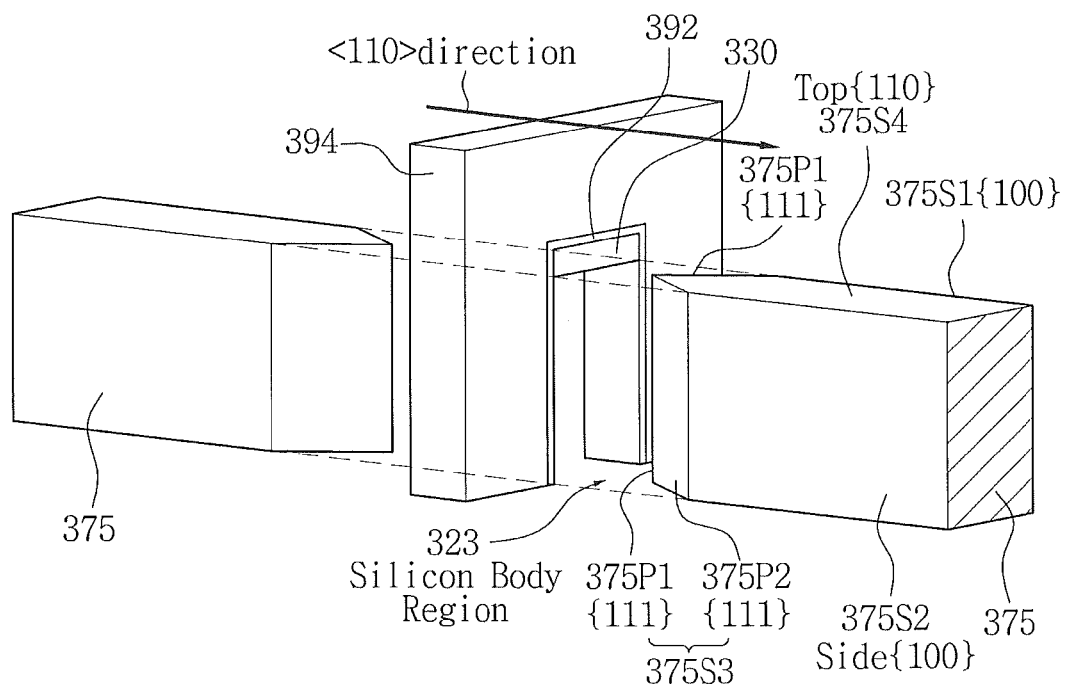
FIG. 1 is a perspective view describing a three-dimensional semiconductor device in accordance with embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As appreciated by the present inventors, in some conventional approaches to forming a trench, the distances between the trench and the gate electrode may be formed irregularly such that, for example, the distance between the trench which is perpendicular to the active region and the gate electrode may have significant variation in each of an upper end area, an intermediate area, and a lower end area. In addition, as further appreciated by the present inventors, due to variation in etching process, a loading effect and size scattering of the trench may vary depending location of the trench in a wafer. Accordingly, an embedded stressor may be utilized to address some of these issues.

Figure 2:
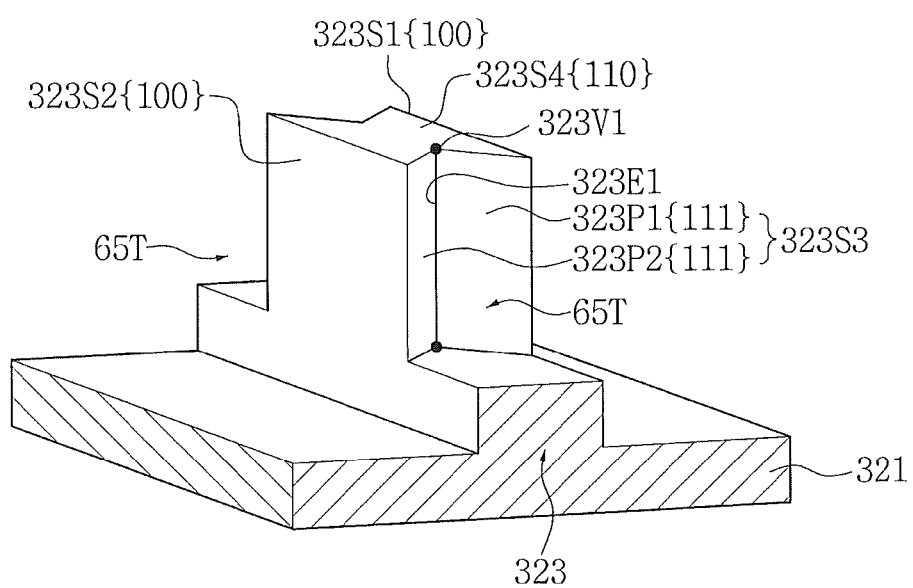
FIG. 2 is an enlarged view showing a part of FIG. 1.
Figure 3:
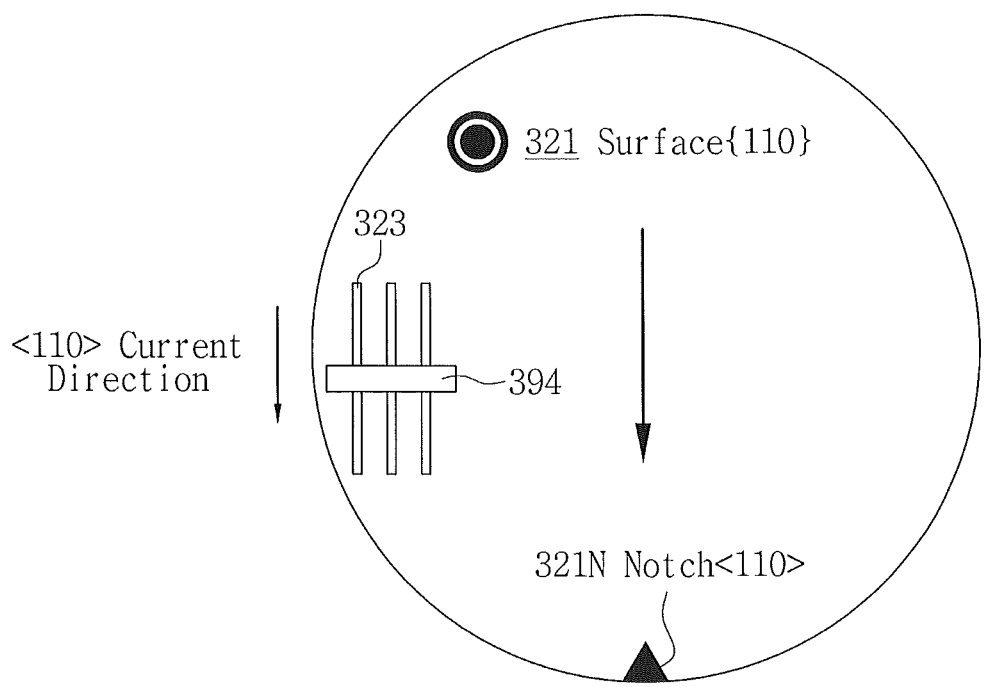
FIGS. 3 and 4 are layout views applicable to embodiments of FIG. 1.
Figure 4:
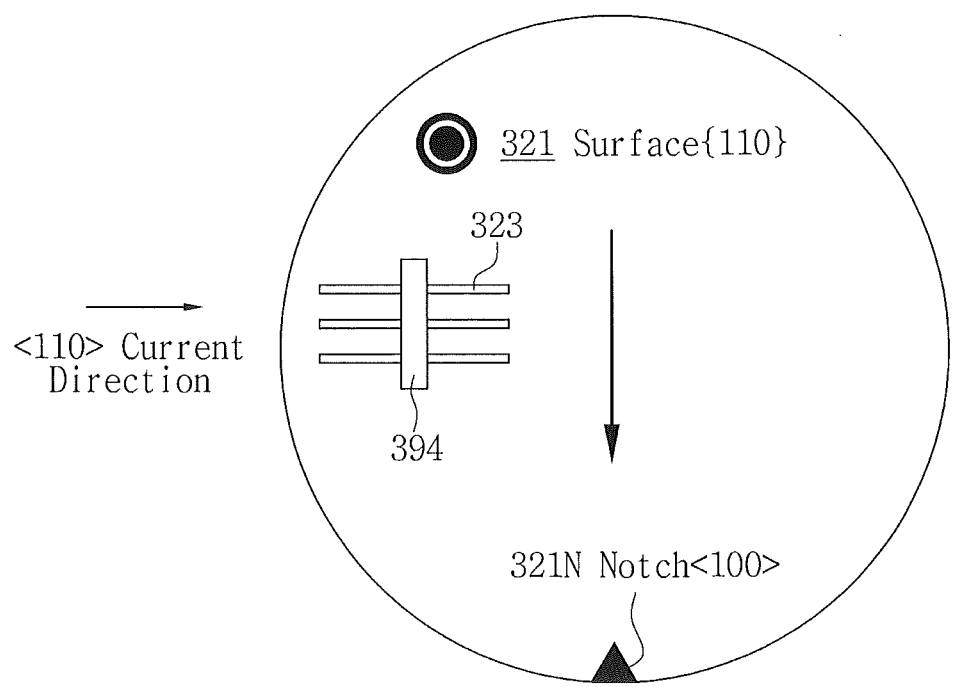

FIG. 1 is a perspective view describing a three-dimensional semiconductor device in accordance with embodiments of the inventive concept, and FIG. 2 is an enlarged view showing a part of FIG. 1 in detail. FIGS. 3 and 4 are layout views applicable to embodiments of FIG. 1.

Referring to FIGS. 1 and 2, an active region 323 may be confined within a substrate 321. A gate electrode 394 crossing the active region 323 may be formed. Trenches 65T may be formed in the active region 323 adjacent to both sides of the gate electrode 394. Strain-inducing patterns 375 may be formed in the trenches 65T. A gate dielectric layer 392 may be formed between the gate electrode 394 and the active region 323. An insulating pattern 330 may be formed on an upper surface 323S4 of the active region 323. The insulating pattern 330 may be retained between the gate dielectric layer 392 and the active region 323. The gate electrode 394 may cover side surfaces of the active region 323.

The active region 323 may be referred to as a silicon body region. The active region 323 may have a horizontal sigma shape. A major axis of the active region 323 may be arranged in <110> direction. The active region 323 may include a first side surface 323S1, a second side surface 323S2, a third side surface 323S3, and the upper surface 323S4. The second side surface 323S2 may be opposite the first side surface 323S1. The third side surface 323S3 may be in contact with the first side surface 323S1, the second side surface 323S2 and the upper surface 323S4. The upper surface 323S4 of the active region 323 may have {110} surface. Each of the first side surface 323S1 and the second side surface 323S2 may have {100} surface.

The third side surface 323S3 may include a first plane 323P1 and a second plane 323P2. Each of the first plane 323P1 and the second plane 323P2 may have {111} surface. The first plane 323P1 may be in contact with the first side surface 323S1 and the upper surface 323S4. The first plane 323P1 may form an acute angle with respect to the first side surface 323S1, and the first plane 323P1 may be perpendicular to the upper surface 323S4. The second plane 323P2 may be in contact with the second side surface 323S2 and the upper surface 323S4. The second plane 323P2 may form an acute angle with respect to the second side surface 323S2, and the second plane 323P2 may be perpendicular to the upper surface 323S4. An edge 323E1, at which the first plane 323P1 and the second plane 323P2 meet, may be perpendicular to the upper surface 323S4 and the substrate 321. A corner point 323V1 (at which the upper surface 323S4, the first plane 323P1, and the second plane 323P2 meet) may have a structure depressed toward the interior of the active region 323. The active region 323 may have a V-shape in a top view.

The strain-inducing patterns 375 may be referred to as an embedded stressor. Each of the strain-inducing patterns 375 may include a first side surface 375S1, a second side surface 375S2, a third side surface 375S3, and an upper surface 375S4. The second side surface 375S2 may be opposite the first side surface 375S1. The third side surface 375S3 may be in contact with the first side surface 375S1, the second side surface 375S2, and the upper surface 375S4. The upper surface 375S4 of the strain-inducing pattern 375 may have the same {110} surface as the upper surface 323S4 of the active region 323. Each of the first side surface 375S1 and the second side surface 375S2 may have {100} surface.

The third side surface 375S3 may include a first plane 375P1 and a second plane 375P2. Each of the first plane 375P1 and the second plane 375P2 may have {111} surface. The first plane 375P1 may be in contact with (directly adjacent to) the first side surface 375S1 and the upper surface 375S4. The first plane 375P1 may form an obtuse angle with respect to the first side surface 375S1, and the first plane 375P1 may be perpendicular to the upper surface 375S4. The second plane 375P2 may be in contact with (directly adjacent to) the second side surface 375S2 and the upper surface 375S4. The second plane 375P2 may form an obtuse angle with respect to the second side surface 375S2, and the second plane 375P2 may be perpendicular to the upper surface 375S4. The first plane 375P1 and the second plane 375P2 may be perpendicular to the substrate 321.

It will be understood that the planes (such as 375P1 and 375P2 and analogous planes described in other embodiments according to the present inventive concept) can be referred to herein as "facets" that are surfaces of the associated strain inducing structures. It will be further understood that the facets can have a {111} crystallographic orientation, and may obliquely face opposing interior side walls of the gate electrode 394. For example, the facets of the strain inducing structures 375 shown in FIG. 1 obliquely face the interior side walls of the gate electrode 394 on which the gate dielectric layer 392 is formed. In some embodiments according to the inventive concept, facets are also included on the associated strain inducing structures 375 to obliquely face the interior side wall of the gate electrode 394 that is opposite to and above the channel. In some embodiments according to the invention, facets are also included on the associated strain inducing structures 375 to obliquely face the active region between the source and drain regions opposite the gate electrode 394.

Each of the strain-inducing patterns 375 may be in contact with the active region 323. The first plane 375P1 of the strain-inducing pattern 375 may be in contact with the first plane 323P1 of the active region 323, and the second plane 375P2 of the strain-inducing pattern 375 may be in contact with the second plane 323P2 of the active region 323. The first plane 375P1 of the strain-inducing pattern 375 may be interpreted as substantially the same interface as the first plane 323P1 of the active region 323, and the second plane 375P2 of the strain-inducing pattern 375 may be interpreted as substantially the same interface as the second plane 323P2 of the active region 323.

Referring to FIG. 3, the substrate 321 may be a semiconductor substrate such as a silicon wafer or silicon on insulator (SOI) wafer having {110} surface. The substrate 321 may include a notch 321N formed in <110> direction. A major axis of the active region 323 may be arranged in <110> direction. The gate electrode 394 may cross the active region 323.

Referring to FIG. 4, the substrate 321 may be a semiconductor substrate such as a silicon wafer or silicon on insulator (SOI) wafer having {110} surface. The substrate 321 may include a notch 321N formed in <100> direction. A major axis of the active region 323 may be arranged perpendicular to <110> direction. The gate electrode 394 may cross the active region 323.

In some embodiments according to the inventive concept, the distance between the gate electrode 394 and the strain-inducing patterns 375 may be controlled to be uniform compared to the related art. Due to the configuration of the gate electrode 394, the active region 323, and the strain-inducing patterns 375, negative bias temperature instability (NBTI) and time dependent dielectric breakdown (TDDB) characteristics may be significantly improved compared to the related art.

Figure 5:
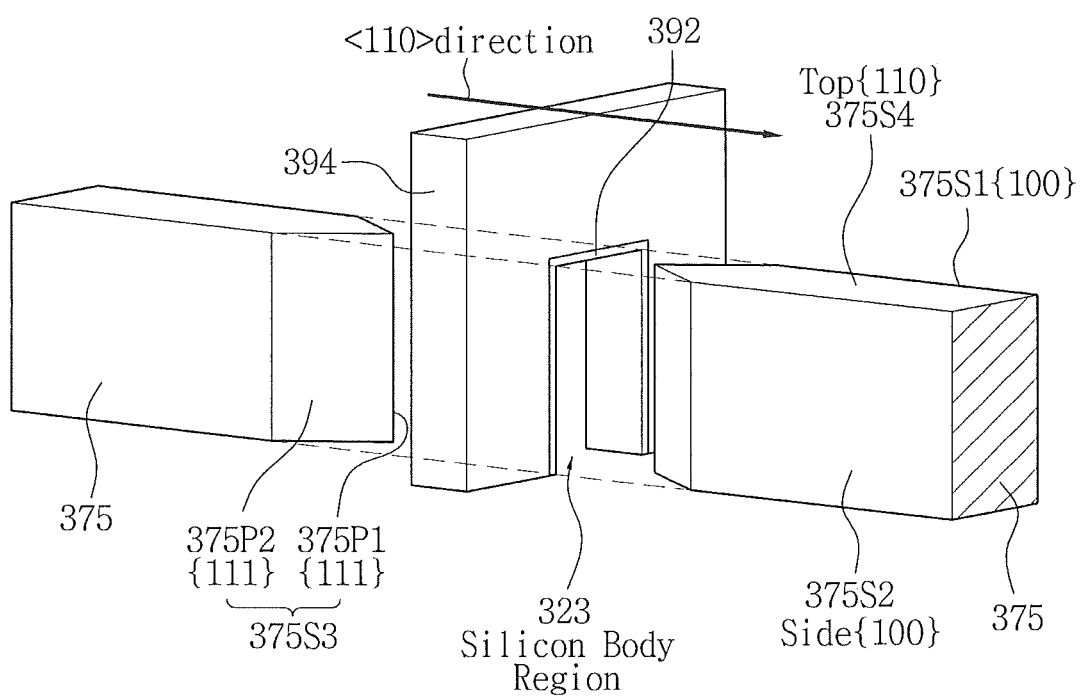
FIGS. 5 and 6 are perspective views describing a three-dimensional semiconductor device in accordance with application embodiments of FIG. 1.
Figure 6:
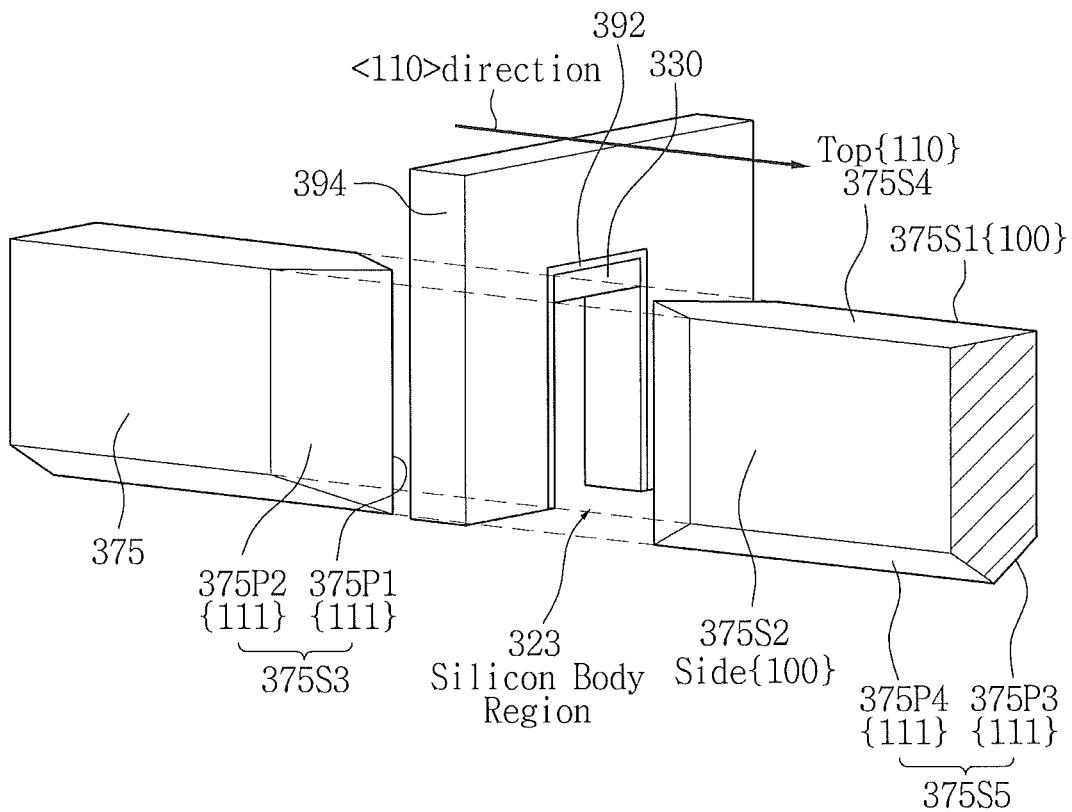
Figure 7:
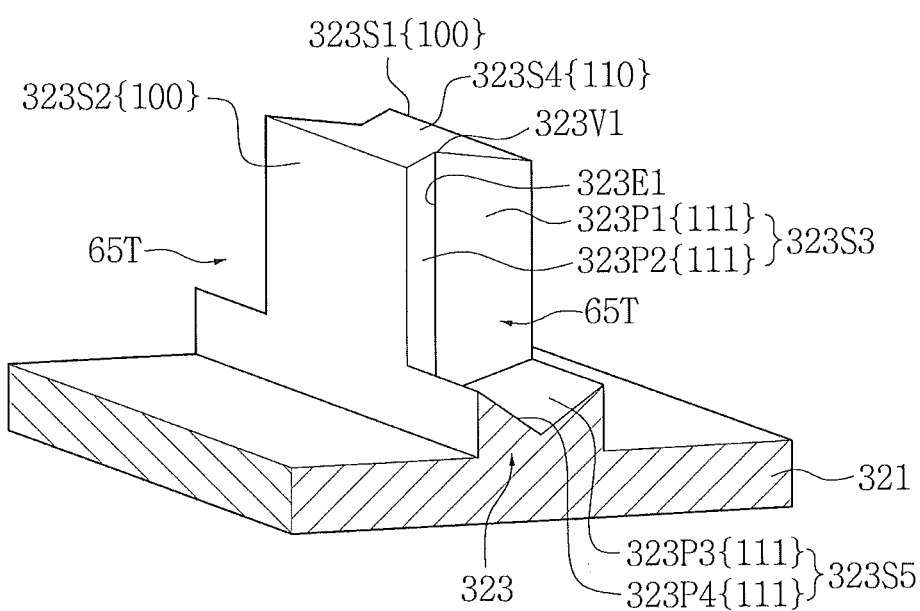
FIG. 7 is an enlarged view showing a part of FIG. 6.

FIGS. 5 and 6 are perspective views describing a three-dimensional semiconductor device in accordance with embodiments of FIG. 1, and FIG. 7 is an enlarged view showing a part of FIG. 6.

Referring to FIG. 5, the insulating pattern 330 shown in FIG. 1 may be omitted and the other components may be similar to those in FIG. 1.

Referring to FIGS. 6 and 7, a lower surface 323S5 of the active region 323 may be formed in the bottom of each of the trenches 65T. The lower surface 323S5 of the active region 323 may include a third plane 323P3 and a fourth plane 323P4. Each of the third plane 323P3 and the fourth plane 323P4 may have {111} surface. The third plane 323P3 may form an acute angle with respect to the first side surface 323S1 of the active region 323. The fourth plane 323P4 may form an acute angle with respect to the second side surface 323S2 of the active region 323.

A bottom surface 375S5 may be formed in the bottom of the strain-inducing pattern 375. The bottom surface 375S5 may include a third plane 375P3 and a fourth plane 375P4. The third plane 375P3 may form an obtuse angle with respect to the first side surface 375S1 of the strain-inducing pattern 375. The fourth plane 375P4 may form an obtuse angle with respect to the second side surface 375S2 of the strain-inducing pattern 375.

Figure 8:
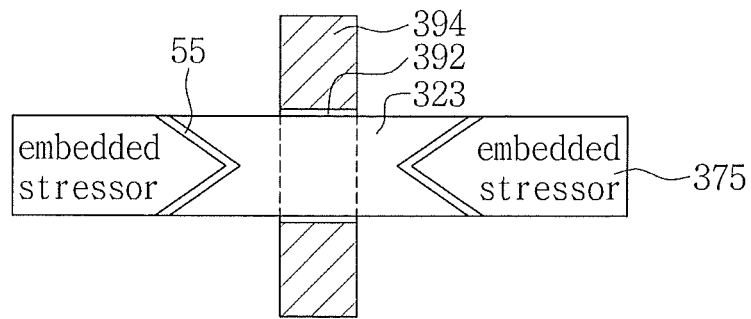
FIGS. 8 to 10 are horizontal cross-sectional views of FIG. 1 for describing a three-dimensional semiconductor device in accordance with embodiments of the inventive concept.
Figure 9:
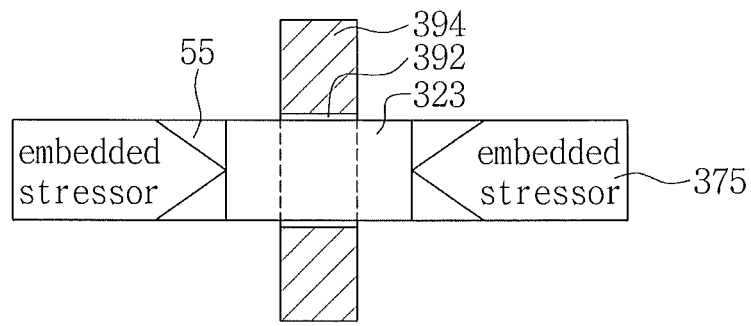
Figure 10:
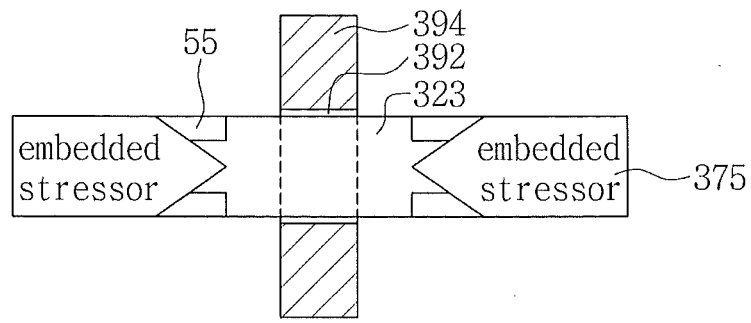

FIGS. 8 to 10 are horizontal cross-sectional views describing a three-dimensional semiconductor device in accordance with embodiments of the inventive concept.

Referring to FIG. 8, lightly doped drains (LDDs) 55 surrounding the surfaces of the strain-inducing pattern 375 may be formed in the active region 323. The LDDs 55 may be interpreted as an extended doped region. The LDDs 55 may be formed to have a uniform thickness along an interface of the strain-inducing pattern 375 and active region 323.

Referring to FIG. 9, the LDDs 55 may be formed a predetermined distance from the gate electrode 394. The LDDs 55 may show a tendency to be thicker nearer the side surfaces to the active region 323.

Referring to FIG. 10, the LDDs 55 may be locally formed close to the side surfaces of the active region 323. The LDDs 55 may be locally formed along the side surfaces of the active region 323 in the interface between the strain-inducing pattern 375 and the active region 323.

Figure 11:
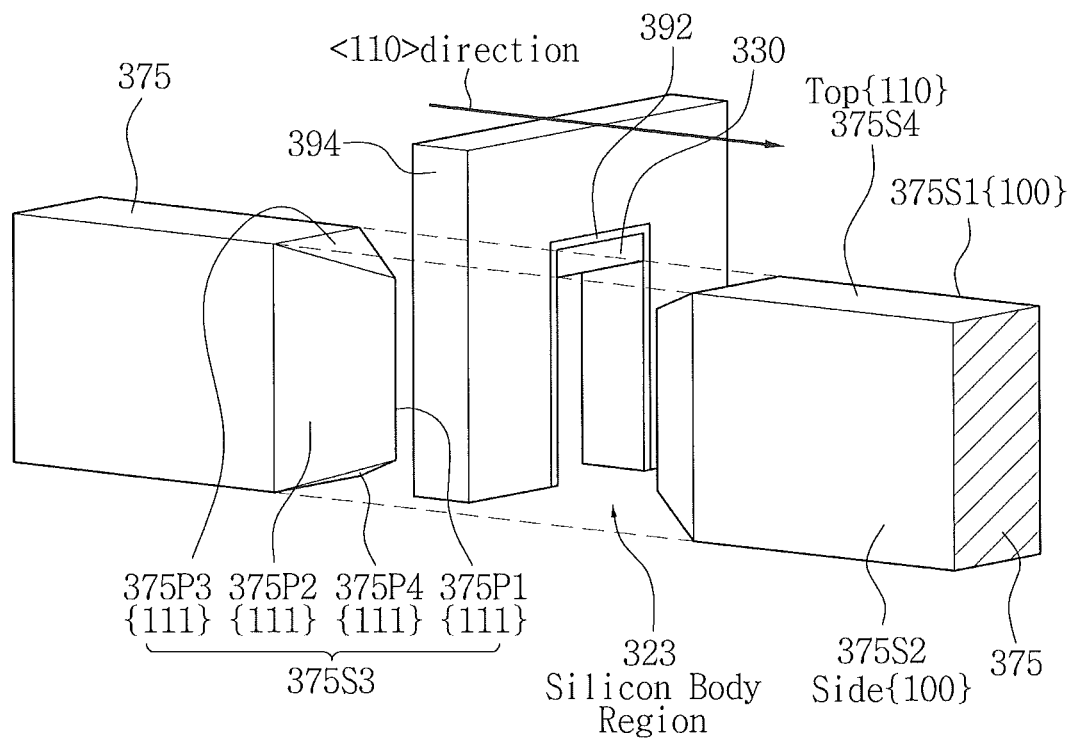
FIG. 11 is a perspective view describing a three-dimensional semiconductor device in accordance with embodiments of the inventive concept.
Figure 12:
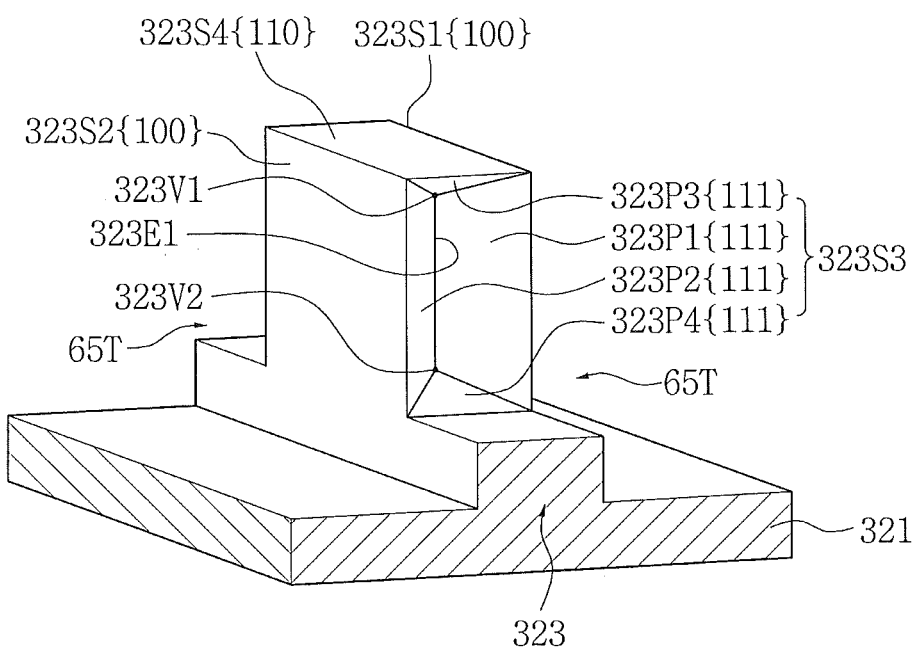
FIG. 12 is an enlarged view showing a part of FIG. 11.
Figure 13:
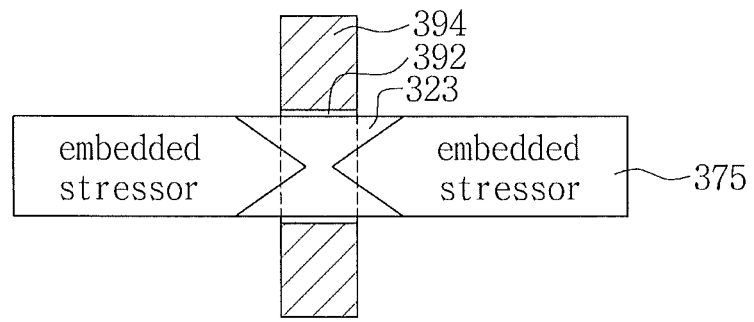
FIG. 13 is a horizontal cross-sectional view of FIG. 11 for describing a three-dimensional semiconductor device in accordance with embodiments of the inventive concept.
Figure 14:
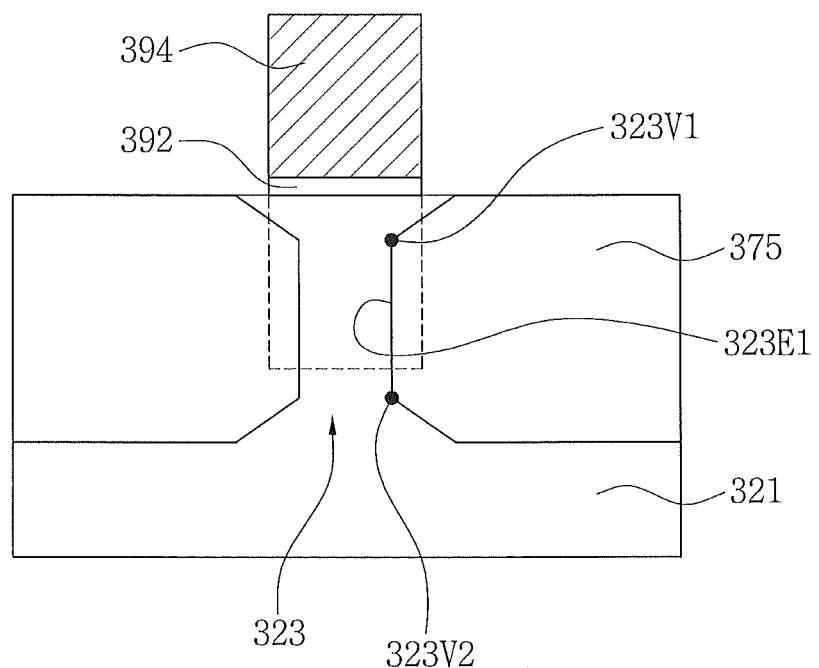
FIG. 14 is a cross-sectional view of FIG. 11 for describing a three-dimensional semiconductor device in accordance with embodiments of the inventive concept.

FIG. 11 is a perspective view describing a three-dimensional semiconductor device in accordance with embodiments of the inventive concept, FIG. 12 is an enlarged view showing a part of FIG. 11, FIG. 13 is a horizontal cross-sectional view of FIG. 11, and FIG. 14 is a cross-sectional view of FIG. 11.

Referring to FIGS. 11 and 12, an active region 323 may be confined within the substrate 321. A gate electrode 394 may be formed across the active region 323. Trenches 65T may be formed in the active region 323 adjacent to both sides of the gate electrode 394. Strain-inducing patterns 375 may be formed in the trenches 65T. A gate dielectric layer 392 may be formed between the gate electrode 394 and the active region 323. An insulating pattern 330 may be formed on an upper surface 323S4 of the active region 323. The insulating pattern 330 may be retained between the gate dielectric layer 392 and the active region 323. The gate electrode 394 may cover side surfaces of the active region 323.

A major axis of the active region 323 may be arranged in <110> direction. The active region 323 may include a first side surface 323S1, a second side surface 323S2, a third side surface 323S3, and the upper surface 323S4. The second side surface 323S2 may be opposite the first side surface 323S1. The third side surface 323S3 may be in contact with the first side surface 323S1, the second side surface 323S2, and the upper surface 323S4. The upper surface 323S4 of the active region 323 may have {110} surface. Each of the first side surface 323S1 and the second side surface 323S2 may have {100} surface.

The third side surface 323S3 may include a first plane 323P1, a second plane 323P2, a third plane 323P3, and a fourth plane 323P4. Each of the first plane 323P1, the second plane 323P2, the third plane 323P3, and the fourth plane 323P4 may have {111} surface. The first plane 323P1 may be in contact with the first side surface 323S1. The first plane 323P1 may form an acute angle with respect to the first side surface 323S1. The second plane 323P2 may be in contact with the second side surface 323S2. The second plane 323P2 may form an acute angle with respect to the second side surface 323S2. The third plane 323P3 may be in contact with the upper surface 323S4. The third plane 323P3 may form an acute angle with respect to the upper surface 323S4. The fourth plane 323P4 may be in contact with the first plane 323P1 and the second plane 323P2.

An edge 323E1 at which the first plane 323P1 and the second plane 323P2 meet, may be perpendicular to the upper surface 323S4 and the substrate 321. A first corner point 323V1 at which the first plane 323P1, the second plane 323P2, and the third plane 323P3 meet may have a structure depressed toward the interior of the active region 323. A second corner point 323V2 at which the first plane 323P1, the second plane 323P2, and the fourth plane 323P4 meet may have a structure depressed toward the interior of the active region 323. The first corner point 323V1, the second corner point 323V2, and the edge 323E1 may be vertically aligned with respect to a surface of the substrate 321.

Each of the strain-inducing patterns 375 may include a first side surface 375S1, a second side surface 375S2, a third side surface 375S3, and the upper surface 375S4. The second side surface 375S2 may be opposite the first side surface 375S1. The third side surface 375S3 may be in contact with the first side surface 375S1, the second side surface 375S2, and the upper surface 375S4. The upper surface 375S4 of the strain-inducing pattern 375 may have {110} surface which is the same as the upper surface 323S4 of the active region 323. Each of the first side surface 375S1 and the second side surface 375S2 may have {100} surface.

The third side surface 375S3 may include a first plane 375P1, a second plane 375P2, a third plane 375P3, and a fourth plane 375P4. Each of the first plane 375P1, the second plane 375P2, the third plane 375P3, and the fourth plane 375P4 may have {111} surface. The first plane 375P1 may be in contact with the first side surface 375S1. The first plane 375P1 may form an obtuse angle with respect to the first side surface 375S1. The second plane 375P2 may be in contact with the second side surface 375S2. The second plane 375P2 may form an obtuse angle with respect to the second side surface 375S2. The first plane 375P1 and the second plane 375P2 may be perpendicular to the substrate 321. The third plane 375P3 may be in contact with the upper surface 375S4. The third plane 375P3 may form an obtuse angle with respect to the upper surface 375S4. The fourth plane 375P4 may be in contact with a bottom of the strain-inducing pattern 375. The fourth plane 375P4 may form an obtuse angle with respect to the bottom of the strain-inducing pattern 375.

Each of strain-inducing patterns 375 may be in contact with the active region 323. The first plane 375P1 of the strain-inducing pattern 375 may be in contact with the first plane 323P1 of the active region 323, the second plane 375P2 of the strain-inducing pattern 375 may be in contact with the second plane 323P2 of the active region 323, the third plane 375P3 of the strain-inducing pattern 375 may be in contact with the third plane 323P3 of the active region 323, and the fourth plane 375P4 of the strain-inducing pattern 375 may be in contact with the fourth plane 323P4 of the active region 323.

Referring to FIG. 13, the strain-inducing patterns 375 may be partially overlapped by the gate electrode 394. The edge 323E1 may be overlapped by the gate electrode 394.

Referring to FIG. 14, the strain-inducing patterns 375 may be partially overlapped by the gate electrode 394 under the gate electrode 394. The edge 323E1 may be formed under the gate electrode 394. The second corner point 323V2 may be formed at a lower level than the lower portion of the gate electrode 394. Interfaces of the active region 323 and the strain-inducing patterns 375 may have a trapezoid shape in a cross-sectional view.

Figure 15:
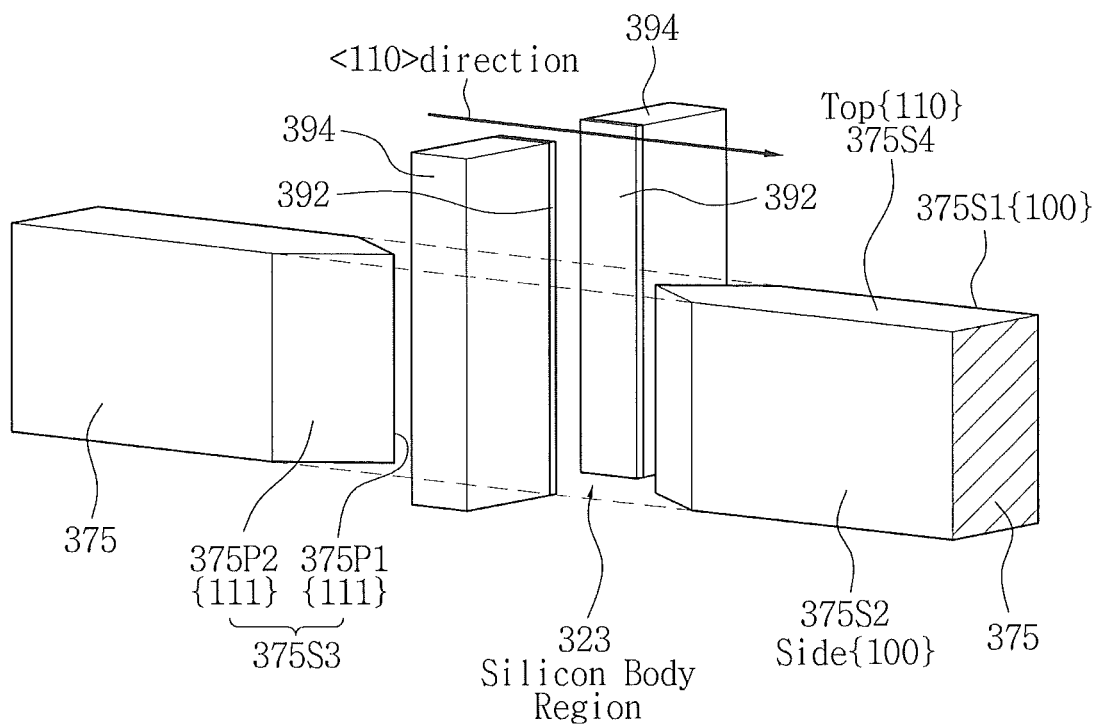
FIG. 15 is a perspective view describing a three-dimensional semiconductor device in accordance with embodiments of the inventive concept.
Figure 16:
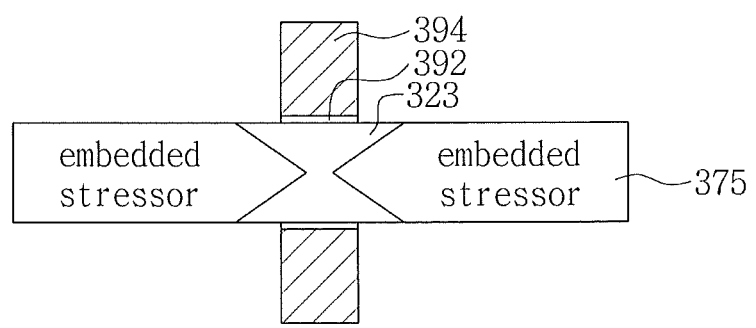
FIG. 16 is a horizontal cross-sectional view of FIG. 15 for describing a three-dimensional semiconductor device in accordance with embodiments of the inventive concept.

FIG. 15 is a perspective view describing a three-dimensional semiconductor device in accordance with embodiments of the inventive concept, and FIG. 16 is a horizontal cross-sectional view of FIG. 15 for describing a three-dimensional semiconductor device in accordance with embodiments of the inventive concept.

Referring to FIG. 15, gate electrodes 394 may be formed on the first side surface 375S1 and second side surface 375S2 of the active region 323. The upper surface 375S4 of the active region 323 may be exposed.

Referring to FIG. 16, the strain-inducing patterns 375 may be partially overlapped with the gate electrodes 394 between the gate electrodes 394.

Figure 17:
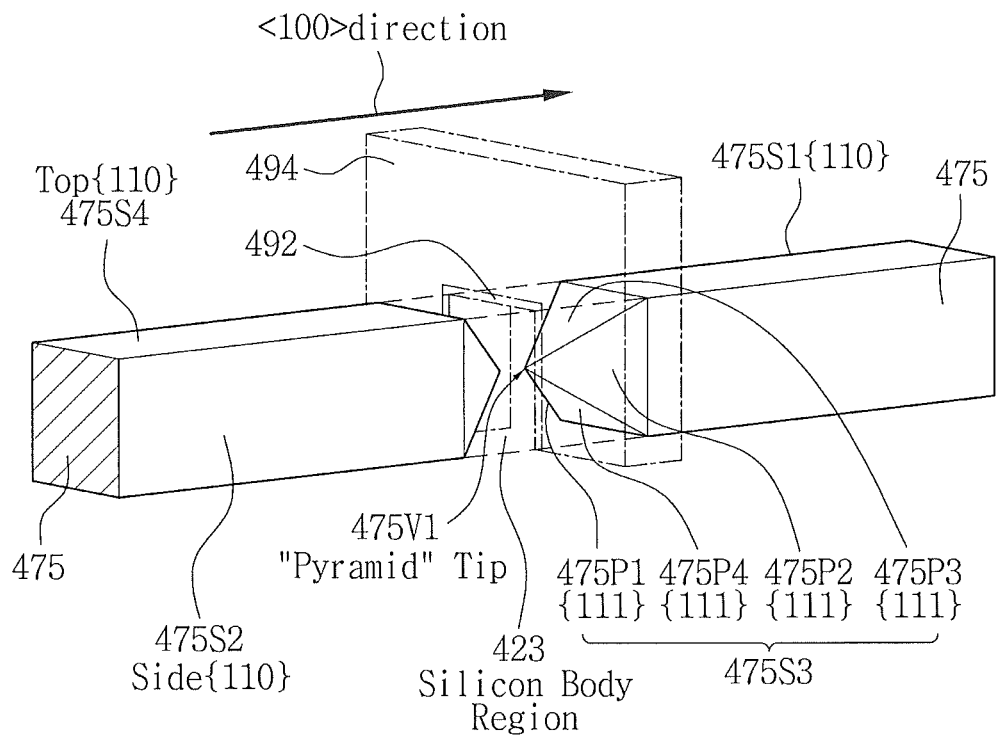
FIG. 17 is a perspective view describing a three-dimensional semiconductor device in accordance with embodiments of the inventive concept.
Figure 18:
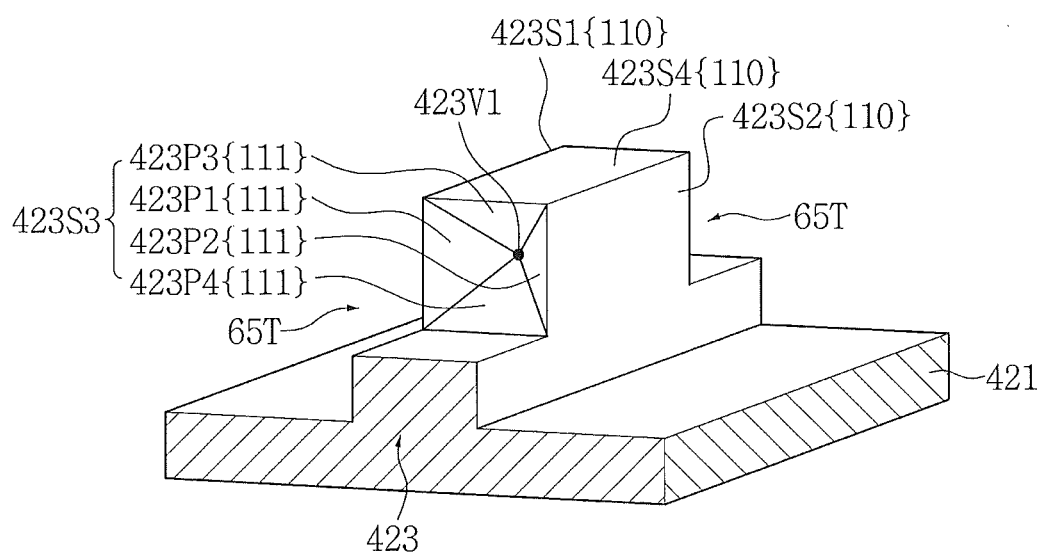
FIG. 18 is an enlarged view showing a part of FIG. 17.
Figure 19:
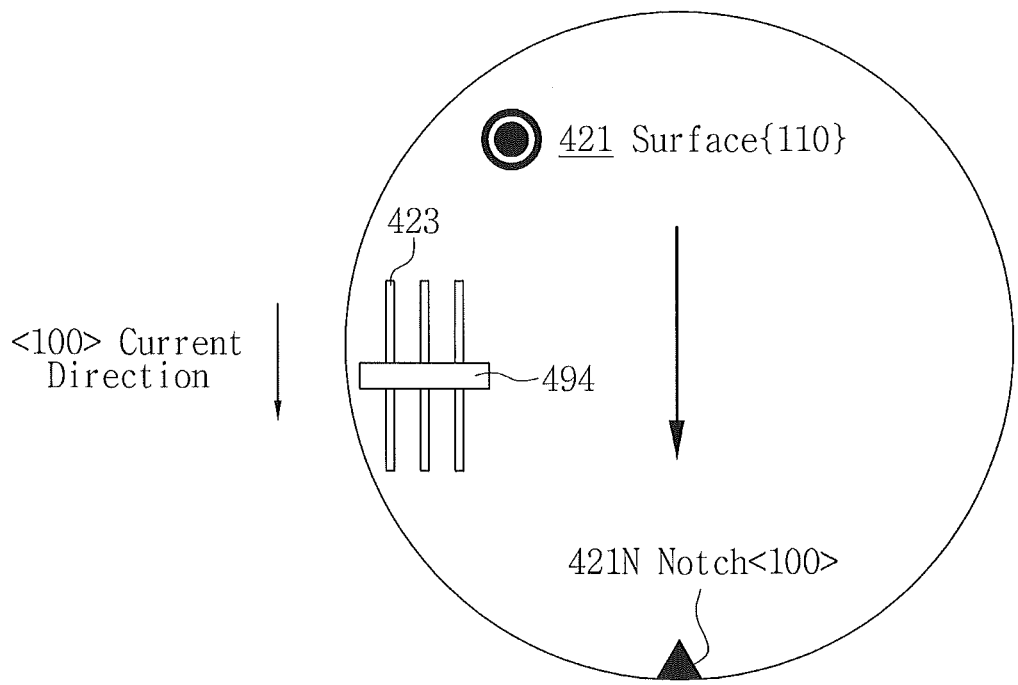
FIGS. 19 and 20 are layout views applicable to embodiments of FIG. 17.
Figure 20:
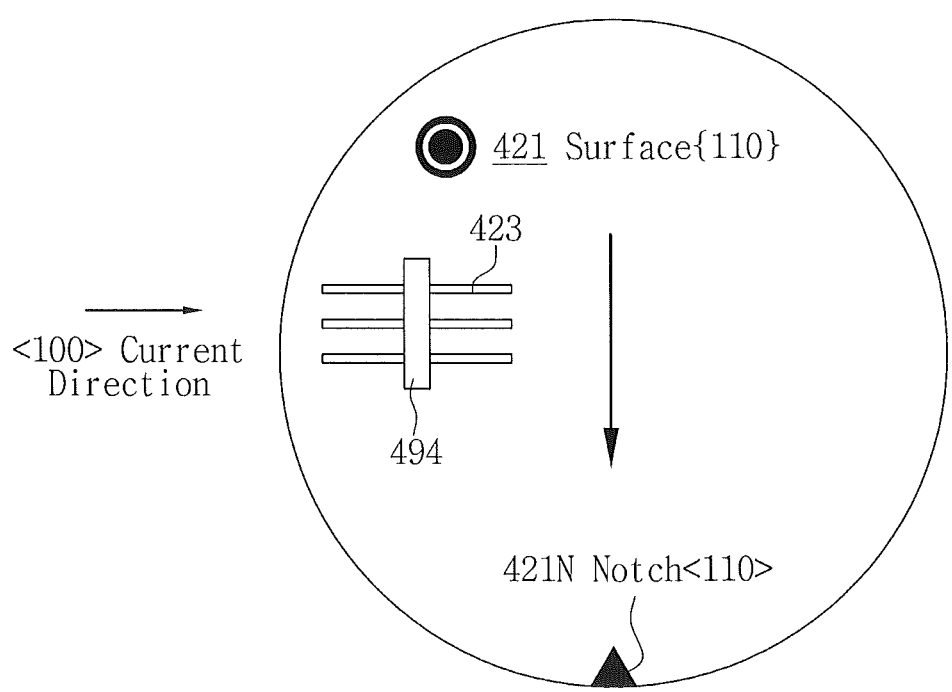

FIG. 17 is a perspective view describing a three-dimensional semiconductor device in accordance with embodiments of the inventive concept, FIG. 18 is an enlarged view showing a part of FIG. 17, and FIGS. 19 and 20 are layout views applicable to application embodiments of FIG. 17.

Referring to FIGS. 17 and 18, an active region 423 may be confined within the substrate 421. A gate electrode 494 may be formed across the active region 423. Trenches 65T may be formed in the active region 423 adjacent to both sides of the gate electrode 494. Strain-inducing patterns 475 may be formed in the trenches 65T. A gate dielectric layer 492 may be formed between the gate electrode 494 and the active region 423. The gate electrode 494 may cover side surfaces of the active region 423.

A major axis of the active region 423 may be arranged in <100> direction. The active region 423 may include a first side surface 423S1, a second side surface 423S2, a third side surface 423S3, and an upper surface 423S4. The second side surface 423S2 may be opposite the first side surface 423S1. The third side surface 423S3 may be in contact with the first side surface 423S1, the second side surface 423S2, and the upper surface 423S4. Each of the upper surface 423S4, first side surface 423S1, and second side surface 423S2 of the active region 423 may have {110} surface.

The third side surface 423S3 of the active region 423 may include a first plane 423P1, a second plane 423P2, a third plane 423P3, and a fourth plane 423P4. Each of the first plane 423P1, the second plane 423P2, the third plane 423P3, and the fourth plane 423P4 may have {111} surface. The first plane 423P1 may be in contact with the first side surface 423S1. The first plane 423P1 may form an acute angle with respect to the first side surface 423S1. The second plane 423P2 may be in contact with the second side surface 423S2. The second plane 423P2 may form an acute angle with respect to the second side surface 423S2. The third plane 423P3 may be in contact with the upper surface 423S4. The third plane 423P3 may form an acute angle with respect to the upper surface 423S4. The fourth plane 423P4 may be in contact with the first plane 423P1 and the second plane 423P2. A corner point 423V1 at which the first plane 423P1, the second plane 423P2, the third plane 423P3, and the fourth plane 423P4 meet may have a structure depressed toward the interior of the active region 423.

Each of the strain-inducing patterns 475 may include a first side surface 475S1, a second side surface 475S2, a third side surface 475S3, and the upper surface 475S4. The second side surface 475S2 may be opposite the first side surface 475S1. The third side surface 475S3 may be in contact with the first side surface 475S1, the second side surface 475S2, and the upper surface 475S4. The upper surface 475S4 of the strain-inducing pattern 475 may have {110} surface which is the same as the upper surface 423S4 of the active region 323. Each of the first side surface 475S1 and the second side surface 475S2 may have {110} surface.

The third side surface 475S3 may include a first plane 475P1, a second plane 475P2, a third plane 475P3, and a fourth plane 475P4. Each of the first plane 475P1, the second plane 475P2, the third plane 475P3, and the fourth plane 475P4 may have {111} surface. The first plane 475P1 may be in contact with the first side surface 475S1. The first plane 475P1 may form an obtuse angle with respect to the first side surface 475S1. The second plane 475P2 may be in contact with the second side surface 475S2. The second plane 475P2 may form an obtuse angle with respect to the second side surface 475S2. The first plane 475P1 and the second plane 475P2 may be perpendicular to the substrate 421. The third plane 475P3 may be in contact with the upper surface 475S4. The third plane 475P3 may form an obtuse angle with respect to the upper surface 475S4. The fourth plane 475P4 may be in contact with a bottom of the strain-inducing pattern 475. The fourth plane 475P4 may form an obtuse angle with respect to the bottom of the strain-inducing pattern 475.

Each of the strain-inducing patterns 475 may be in contact with the active region 423. The first plane 475P1 of the strain-inducing pattern 475 may be in contact with the first plane 423P1 of the active region 423, the second plane 475P2 of the strain-inducing pattern 475 may be in contact with the second plane 423P2 of the active region 423, the third plane 475P3 of the strain-inducing pattern 475 may be in contact with the third plane 423P3 of the active region 423, and the fourth plane 475P4 of the strain-inducing pattern 475 may be in contact with the fourth plane 423P4 of the active region 423.

A corner point 475V1 at which the first plane 475$p$1, the second plane 475P2, the third plane 475P3, and the fourth plane 475P4 meet may be referred to as a pyramid-tip. The first plane 475$p$1, second plane 475P2, third plane 475P3, and fourth plane 475P4 of the strain-inducing pattern 475 may be referred to as a pyramid-shape.

Referring to FIG. 19, the substrate 421 may be a semiconductor substrate such as a silicon wafer or SOI wafer having {110} surface. The substrate 421 may include a notch 421N formed in <100> direction. A major axis of the active region 423 may be arranged in <100> direction. The gate electrode 494 may cross the active region 423.

Referring to FIG. 20, the substrate 421 may be a semiconductor substrate such as a silicon wafer or SOI wafer having {110} surface. The substrate 421 may include a notch 421N formed in <110> direction. A major axis of the active region 423 may be arranged perpendicular to <110> direction. The gate electrode 494 may cross the active region 423.

Figure 21:
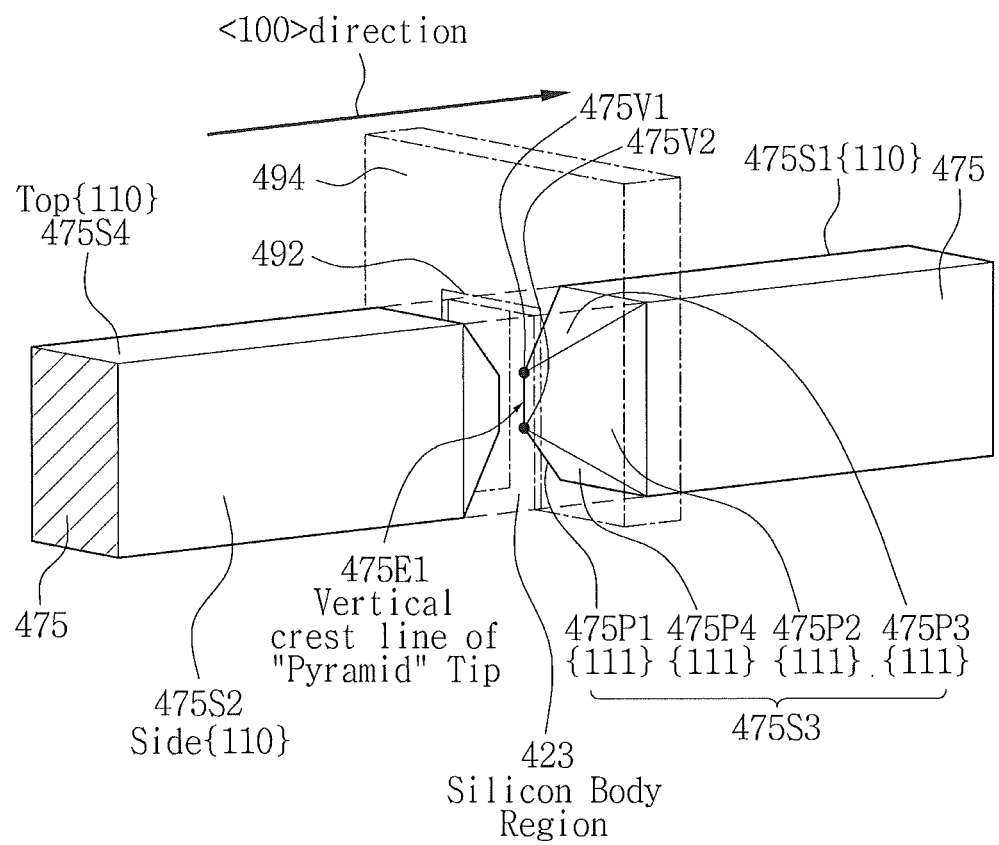
FIG. 21 is a perspective view describing a three-dimensional semiconductor device in accordance with application embodiments of FIG. 17.
Figure 22:
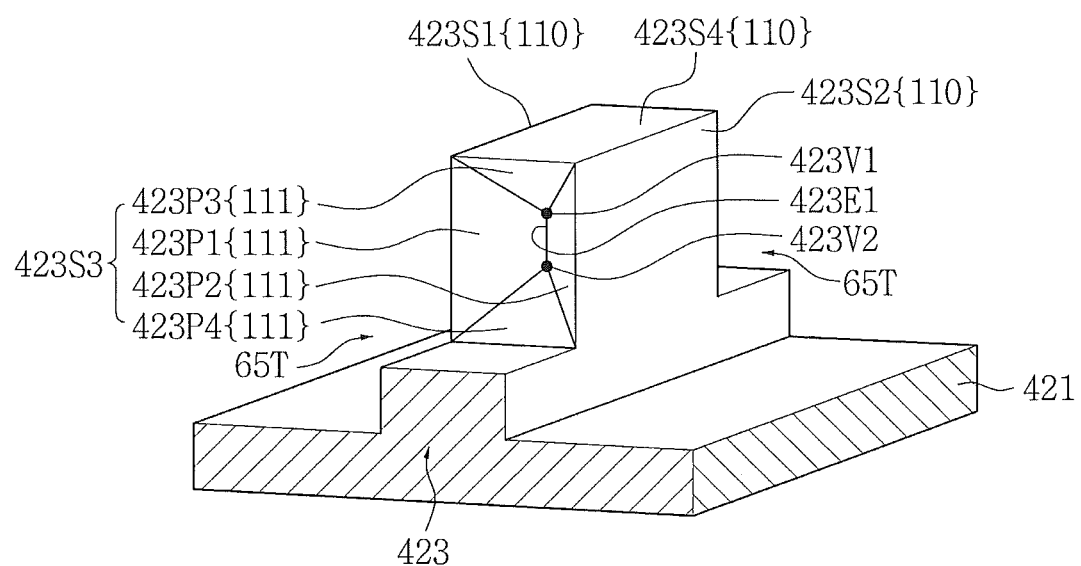
FIG. 22 is an enlarged view showing a part of FIG. 21.

FIG. 21 is a perspective view describing a three-dimensional semiconductor device in accordance with embodiments of the inventive concept, and FIG. 22 is an enlarged view showing a part of FIG. 21 in detail.

Referring to FIGS. 21 and 22, an active region 423 may be confined within the substrate 421. A gate electrode 494 may be formed across the active region 423. Trenches 65T may be formed in the active region 423 adjacent to both sides of the gate electrode 494. Strain-inducing patterns 475 may be formed in the trenches 65T. A gate dielectric layer 492 may be formed between the gate electrode 494 and the active region 423. The gate electrode 494 may cover side surfaces of the active region 423.

A major axis of the active region 423 may be arranged in <100> direction. The active region 423 may include a first side surface 423S1, a second side surface 423S2, a third side surface 423S3, and an upper surface 423S4. The second side surface 423S2 may be opposite the first side surface 423S1. The third side surface 423S3 may be in contact with the first side surface 423S1, the second side surface 423S2, and the upper surface 423S4. Each of the upper surface 423S4, first side surface 423S1, and second side surface 423S2 of the active region 423 may have {110} surface.

The third side surface 423S3 of the active region 423 may include a first plane 423P1, a second plane 423P2, a third plane 423P3, and a fourth plane 423P4. Each of the first plane 423P1, the second plane 423P2, the third plane 423P3, and the fourth plane 423P4 may have {111} surface. The first plane 423P1 may be in contact with the first side surface 423S1. The first plane 423P1 may form an acute angle with respect to the first side surface 423S1. The second plane 423P2 may be in contact with the second side surface 423S2. The second plane 423P2 may form an acute angle with respect to the second side surface 423S2. The third plane 423P3 may be in contact with the upper surface 423S4. The third plane 423P3 may form an acute angle with respect to the upper surface 423S4. The fourth plane 423P4 may be in contact with the first plane 423P1 and the second plane 423P2. An edge 423E1 at which the first plane 423P1 and the second plane 423P2 meet, may be perpendicular to the substrate 421. A first corner point 423V1 at which the first plane 423P1, the second plane 423P2, and the third plane 423P3 meet may have a structure depressed toward the interior of the active region 423. A second corner point 423V2 at which the first plane 423P1, the second plane 423P2, and the fourth plane 423P4 meet may have a structure depressed toward the interior of the active region 423. The first corner point 423V1, the second corner point 423V2, and the edge 423E1 may be vertically aligned with respect to the upper surface 423S4 of the active region 423 and a surface of the substrate 321.

Each of the strain-inducing patterns 475 may include a first side surface 475S1, a second side surface 475S2, a third side surface 475S3, and the upper surface 475S4. The second side surface 475S2 may be opposite the first side surface 475S1. The third side surface 475S3 may be in contact with the first side surface 475S1, the second side surface 475S2, and the upper surface 475S4. The upper surface 475S4 of the strain-inducing pattern 475 may have {110} surface which is the same as the upper surface 423S4 of the active region 323.

Each of the first side surface 475S1 and the second side surface 475S2 may have {110} surface.

The third side surface 475S3 may include a first plane 475P1, a second plane 475P2, a third plane 475P3, and a fourth plane 475P4. Each of the first plane 475P1, the second plane 475P2, the third plane 475P3, and the fourth plane 475P4 may have {111} surface. The first plane 475P1 may be in contact with the first side surface 475S1. The first plane 475P1 may form an obtuse angle with respect to the first side surface 475S1. The second plane 475P2 may be in contact with the second side surface 475S2. The second plane 475P2 may form an obtuse angle with respect to the second side surface 475S2. The first plane 475P1 and the second plane 475P2 may be perpendicular to the substrate 421. The third plane 475P3 may be in contact with the upper surface 475S4. The third plane 475P3 may form an obtuse angle with respect to the upper surface 475S4. The fourth plane 475P4 may be in contact with a bottom of the strain-inducing pattern 475. The fourth plane 475P4 may form an obtuse angle with respect to the bottom of the strain-inducing pattern 475.

An edge 475E1 at which the first plane 475P1 and the second plane 475P2 meet may be perpendicular to the upper surface 475S4 and the substrate 421. The edge 475E1 of the strain-inducing pattern 475 may be referred to as a vertical crest line of a pyramid-tip. The first plane 475P1, second plane 475P2, and third plane 475P3 of the strain-inducing pattern 475 may meet to form a first corner point 475V1, and the first plane 475P1, second plane 475P2, and fourth plane 475P4 of the strain-inducing pattern 475 may meet to form a second corner point 475V2. The first corner point 475V1, the edge 475E1, and the second corner point 475V2 may be vertically aligned with the surface of the substrate 421.

Each of the strain-inducing patterns 475 may be in contact with the active region 423. The first plane 475P1 of the strain-inducing pattern 475 may be in contact with the first plane 423P1 of the active region 423, the second plane 475P2 of the strain-inducing pattern 475 may be in contact with the second plane 423P2 of the active region 423, the third plane 475P3 of the strain-inducing pattern 475 may be in contact with the third plane 423P3 of the active region 423, and the fourth plane 475P4 of the strain-inducing pattern 475 may be in contact with the fourth plane 423P4 of the active region 423.

Figure 23:
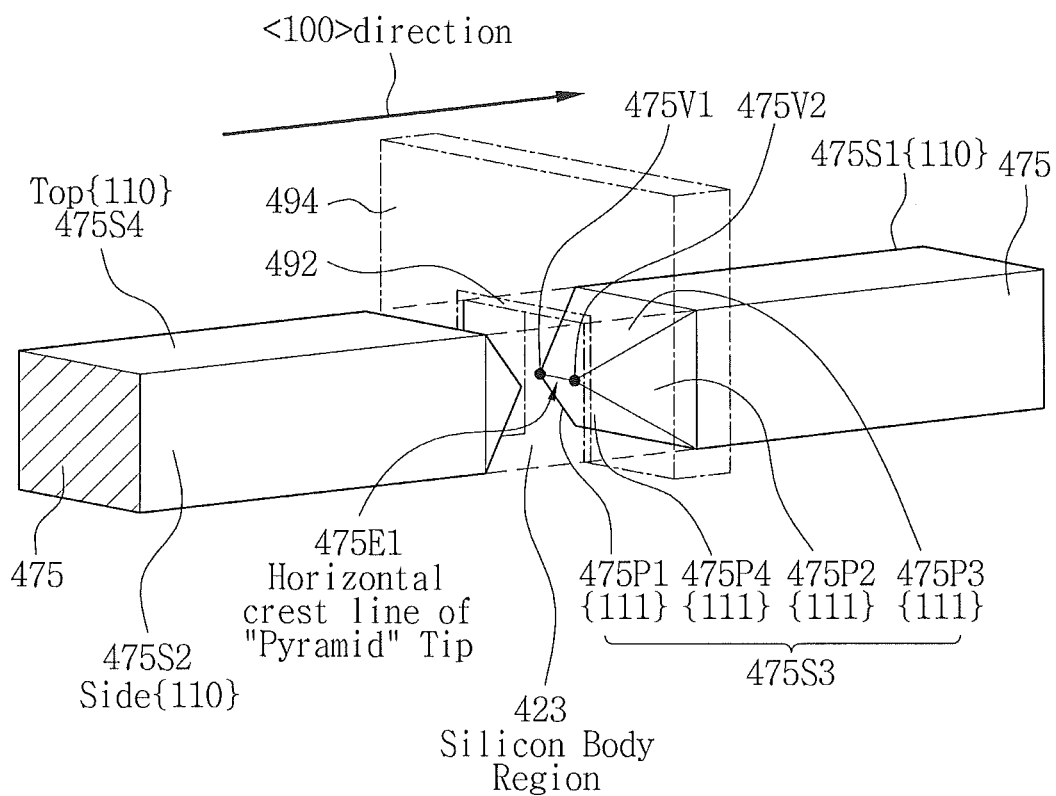
FIG. 23 is a perspective view describing a three-dimensional semiconductor device in accordance with application embodiments of FIG. 17.
Figure 24:
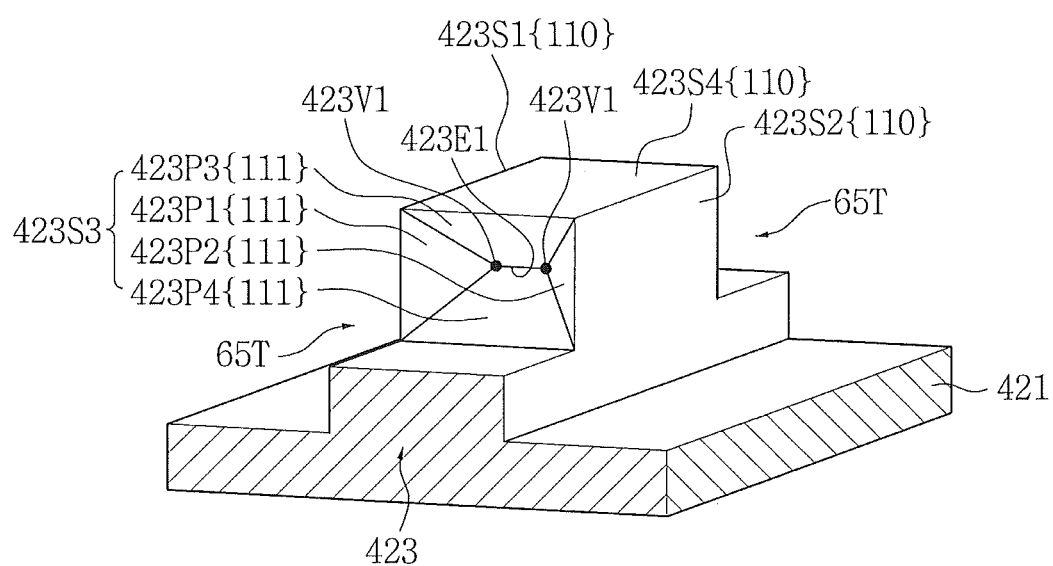
FIG. 24 is an enlarged view showing a part of FIG. 23.
Figure 25:
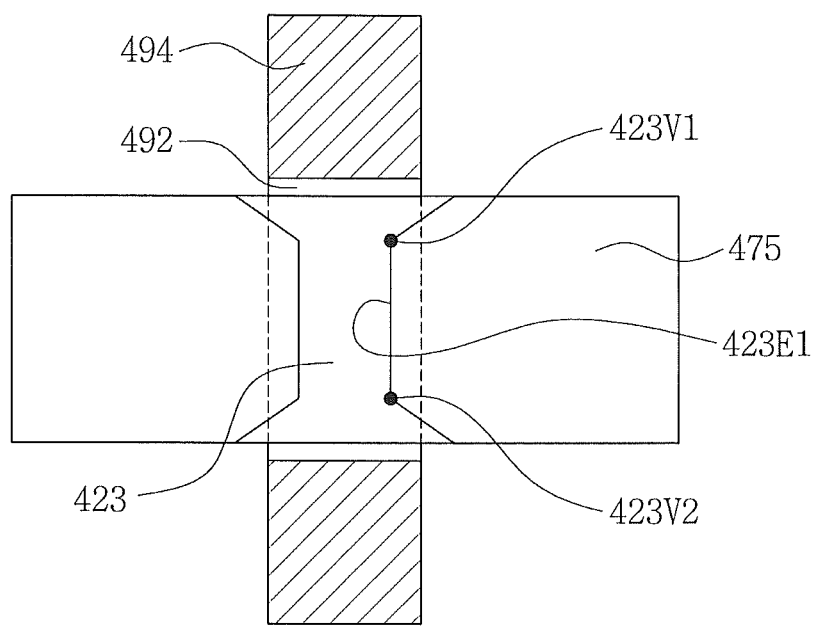
FIG. 25 is a cross-sectional view of FIG. 23.

FIG. 23 is a perspective view describing a three-dimensional semiconductor device in accordance with application embodiments of FIG. 17, FIG. 24 is an enlarged view showing a part of FIG. 23, and FIG. 25 is a horizontal cross-sectional view of FIG. 23.

Referring to FIGS. 23 and 24, the active region 423 may include a first side surface 423S1, a second side surface 423S2, a third side surface 423S3, and an upper surface 423S4. Each of the upper surface 423S4, first side surface 423S1, and second side surface 423S2 of the active region 423 may have {110} surface.

The third side surface 423S3 may include a first plane 423P1, a second plane 423P2, a third plane 423P3, and a fourth plane 423P4. Each of the first plane 423P1, the second plane 423P2, the third plane 423P3, and the fourth plane 423P4 may have {111} surface. An edge 423E1 at which the third plane 423P3 and the fourth plane 423P4 meet may be parallel to the upper surface 423S4 and the substrate 421. A first corner point 423V1 at which the first plane 423P1, the third plane 423P3, and the fourth plane 423P4 meet may have a structure depressed toward the interior of the active region 423. A second corner point 423V2 at which the second plane 423P2, the third plane 423P3, and the fourth plane 423P4 meet may have a structure depressed toward the interior of the active region 423. The first corner point 423V1, the second corner point 423V2, and the edge 423E1 may be aligned parallel to the upper surface 423S4 of the active region 423 and the surface of the substrate 421.

Each of the strain-inducing patterns 475 may be in contact with the active region 423. Each of the strain-inducing patterns 475 may include a first side surface 475S1, a second side surface 475S2, a third side surface 475S3, and a fourth side surface 475S4. The fourth side surface 475S4 of the strain-inducing pattern 475 may have {110} surface which is the same as the upper surface 423S4 of the active region 423. Each of the first side surface 475S1 and the second side surface 475S2 may have {110} surface.

The third side surface 475S3 may include a first plane 475P1, a second plane 475P2, a third plane 475P3, and a fourth plane 475P4. Each of the first plane 475P1, the second plane 475P2, the third plane 475P3, and the fourth plane 475P4 may have {111} surface. An edge 475E1 at which the third plane 475P3 and fourth plane 475P4 of the strain-inducing pattern 475 meet may be parallel to the fourth side surface 475S4 and the substrate 421. The edge 475E1 of the strain-inducing pattern 475 may be referred to as a horizontal crest line of a pyramid-tip. The first plane 475P1, third plane 475P3, and fourth plane 475P4 of the strain-inducing pattern 475 may meet to configure a first corner point 475V1, and the second plane 475P2, third plane 475P3, and fourth plane 475P4 of the strain-inducing pattern 475 may meet to configure a second corner point 475V2. The first corner point 475V1, the edge 475E1, and the second corner point 475V2 may be aligned with the surface of the substrate 421.

Referring to FIG. 25, the first corner point 475V1, the edge 475E1, and the second corner point 475V2 may be overlapped by a gate electrode 494. An interface between the active region 423 and the strain-inducing pattern 475 may have a trapezoidal shape in a top view.

Figure 26:
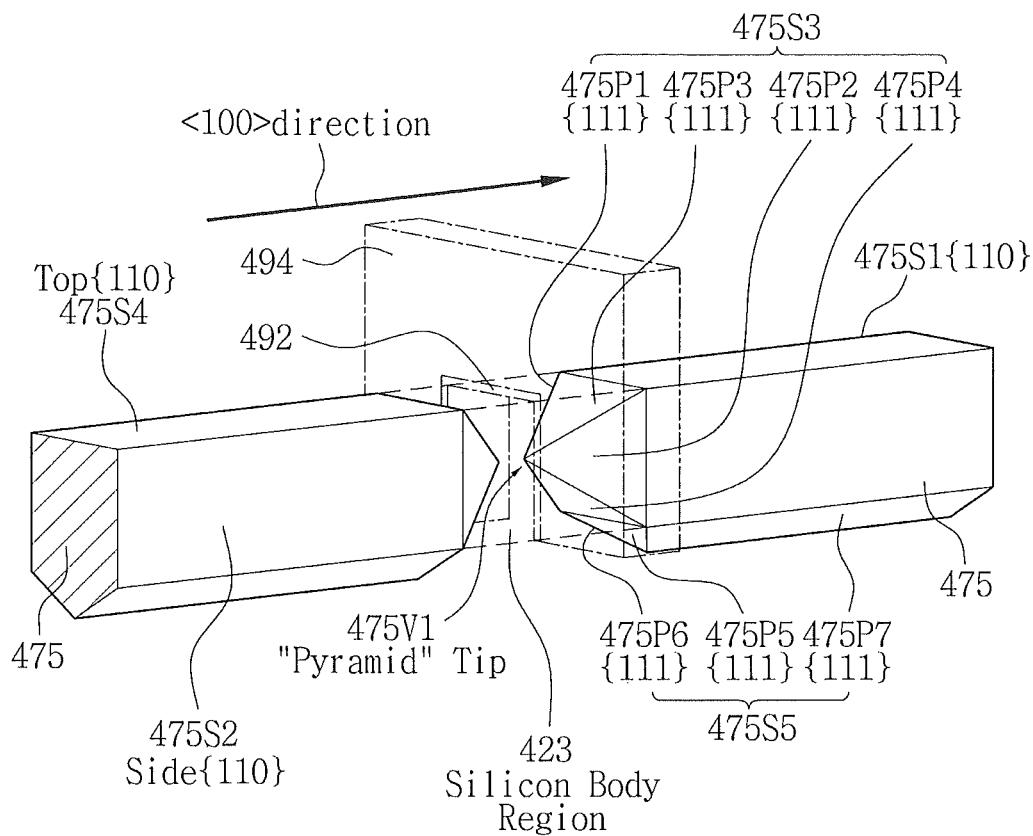
FIG. 26 is a perspective view describing a three-dimensional semiconductor device in accordance with application embodiments of FIG. 17.
Figure 27:
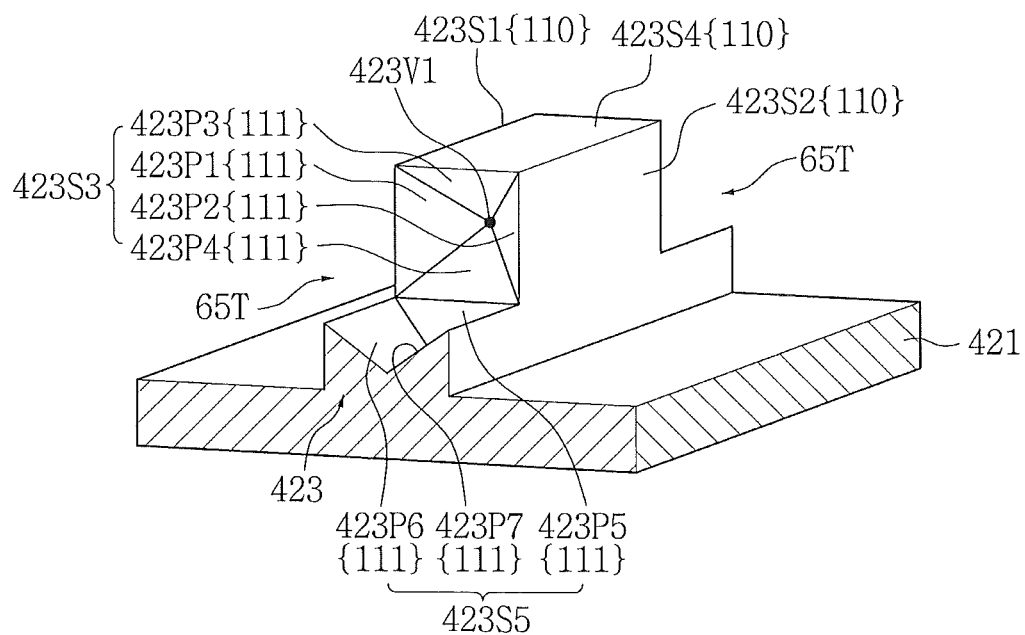
FIG. 27 is an enlarged view showing a part of FIG. 26.

FIG. 26 is a perspective view describing a three-dimensional semiconductor device in accordance with application embodiments of FIG. 17, and FIG. 27 is an enlarged view showing a part of FIG. 26 in detail.

Referring to FIGS. 26 and 27, a lower surface 423S5 may be formed in a bottom of each of trenches 65T. The lower surface 423S5 of the active region 423 may include a fifth plane 423P5, a sixth plane 423P6, and a seventh plane 423P7. Each of the fifth plane 423P5, the sixth plane 423P6, and the seventh plane 423P7 may have {111} surface. The sixth plane 423P6 may form an acute angle with respect to the first side surface 423S1 of the active region 423. The seventh plane 423P7 may form an acute angle with respect to the second side surface 423S2 of the active region 423. The fifth plane 423P5 may be in contact with the fourth plane 423P4, the sixth plane 423P6, and the seventh plane 423P7.

In some embodiments, the fifth plane 423P5 of the active region 423 may have {111} surface contiguous to the fourth plane 423P4. For example, an edge or boundary between the fifth plane 423P5 and the fourth plane 423P4 may be invisible or not formed.

A bottom surface 475S5 may be formed on a bottom of the strain-inducing pattern 475. The bottom surface 475S5 may include a fifth plane 475P5, a sixth plane 475P6, and a seventh plane 475P7. The sixth plane 475P6 may form an obtuse angle with respect to the first side surface 475S1 of the strain-inducing pattern 475. The seventh plane 475P7 may form an obtuse angle with respect to the second side surface 475S2 of the strain-inducing pattern 475. The fifth plane 475P5 may be in contact with the fourth plane 475P4, the sixth plane 475P6, and the seventh plane 475P7.

In some embodiments, the fifth plane 475P5 of the strain-inducing pattern 475 may have {111} surface contiguous to the fourth plane 475P4. For example, an edge or boundary between the fifth plane 475P5 and the fourth plane 475P4 may be invisible or not formed.

Figure 28:
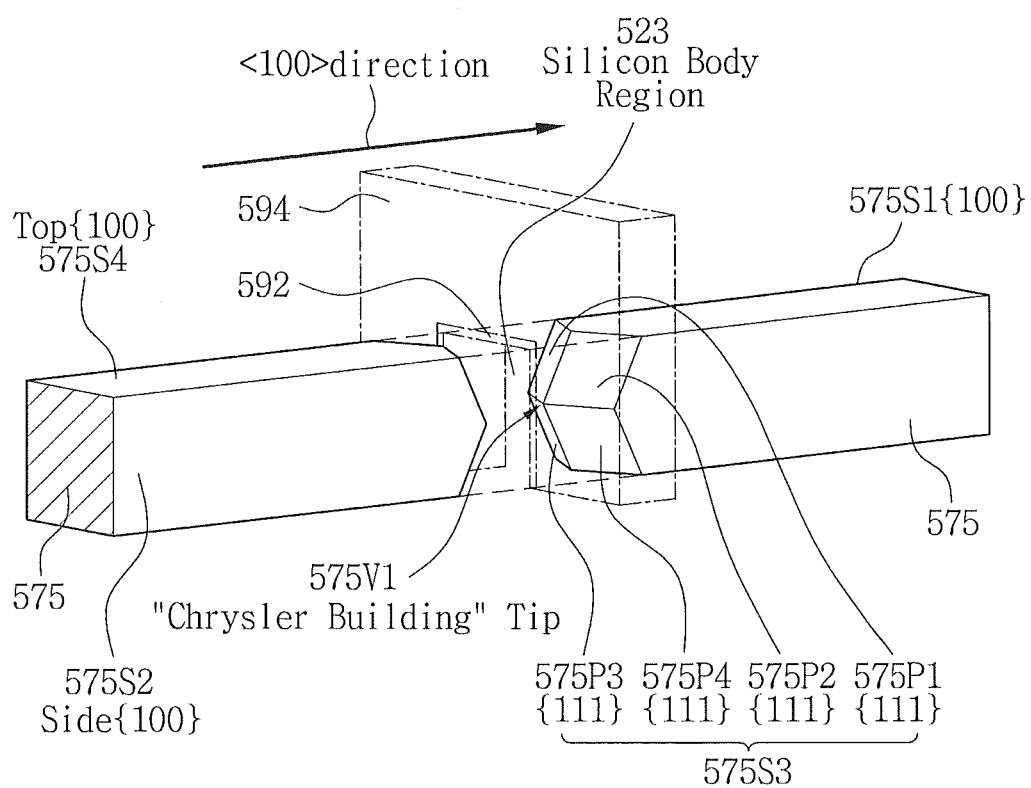
FIG. 28 is a perspective view describing a three-dimensional semiconductor device in accordance with embodiments of the inventive concept.
Figure 29:
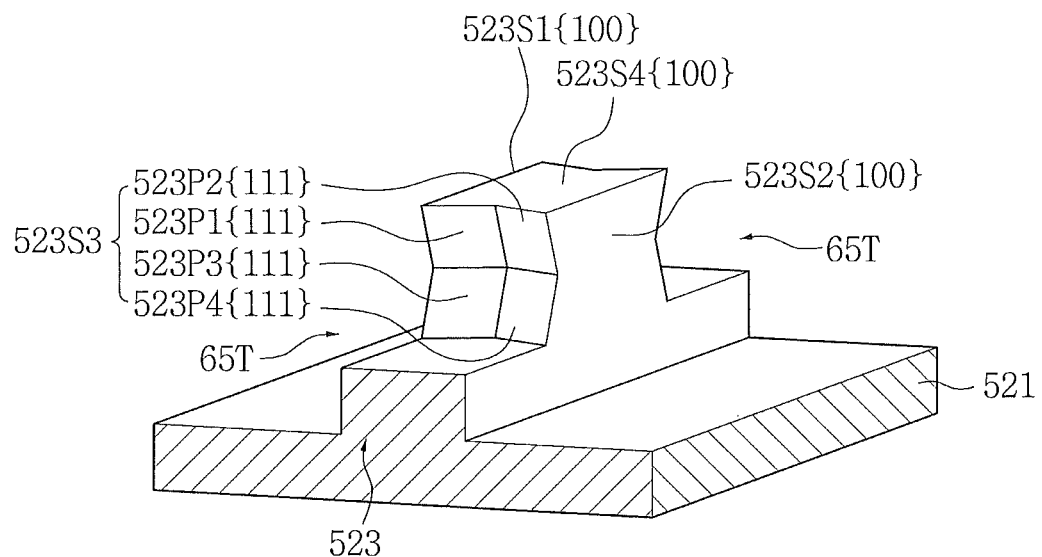
FIGS. 29 and 30 are enlarged views showing a part of FIG. 28.
Figure 30:
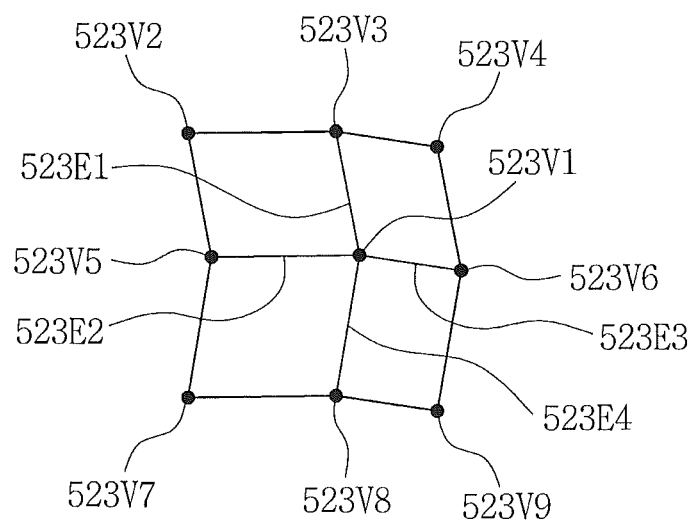
Figure 31:
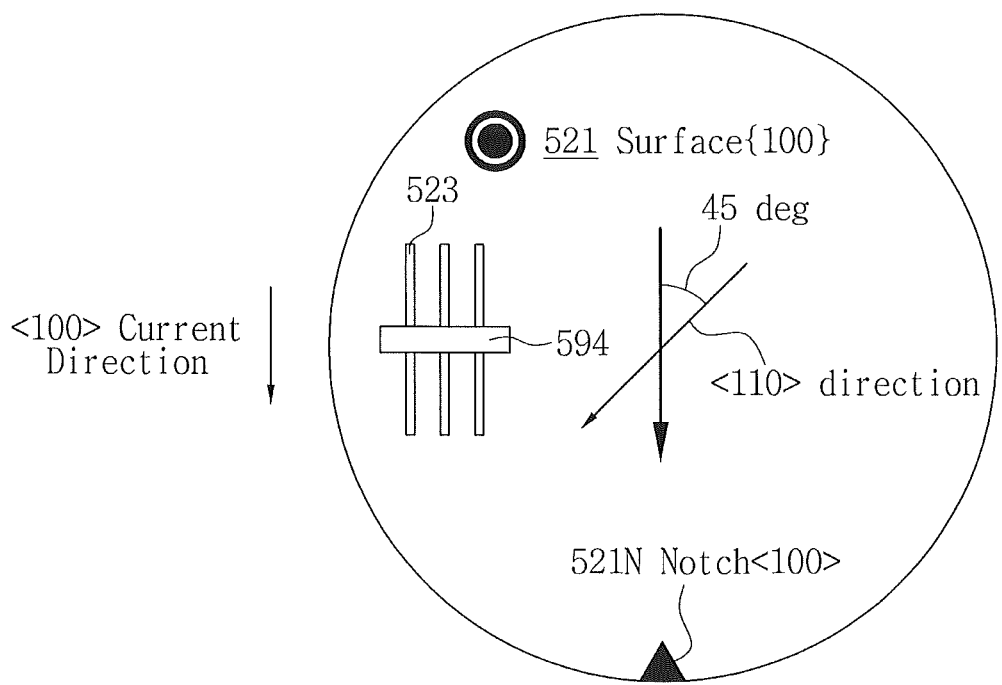
FIG. 31 is a layout view applicable to embodiments of FIG. 28.

FIG. 28 is a perspective view describing a three-dimensional semiconductor device in accordance with embodiments of the inventive concept, FIGS. 29 and 30 are enlarged views showing a part of FIG. 28 in detail, and FIG. 31 is a layout view applicable to embodiments of FIG. 28.

Referring to FIGS. 28, 29, and 30, an active region 323 may be confined within a substrate 521. A gate electrode 594 across the active region 523 may be formed. Trenches 65T may be formed in the active region 523 adjacent to both sides of the gate electrode 594. Strain-inducing patterns 575 may be formed in the trenches 65T. A gate dielectric layer 592 may be formed between the gate electrode 594 and the active region 523. The gate electrode 594 may cover side surfaces of the active region 523.

A major axis of the active region 523 may be arranged in <100> direction. The active region 523 may include a first side surface 523S1, a second side surface 523S2, a third side surface 523S3, and an upper surface 523S4. The second side surface 523S2 may be opposite the first side surface 523S1. The third side surface 523S3 may be in contact with the first side surface 523S1, the second side surface 523S2, and the upper surface 523S4. Each of the upper surface 523S4, first side surface 523S1, and second side surface 523S2 of the active region 523 may have {100} surface.

The third side surface 523S3 may include a first plane 523P1 and a second plane 523P2, a third plane 523S3, and a fourth plane 523P4. Each of the first plane 523P1, the second plane 523P2, the third plane 523P3, and the fourth plane 523P4 may have {111} surface. The first plane 523P1 may be in contact with the first side surface 523S1 and the upper surface 523S4. The first plane 523P1 may form an acute angle with respect to each of the first side surface 523S1 and the upper surface 523S4. The second plane 523P2 may be in contact with the second side surface 523S2 and the upper surface 523S4. The second plane 523P2 may form an acute angle with respect to each of the second side surface 523S2 and the upper surface 523S4. The third plane 523P3 may be in contact with the first side surface 523S4 and a bottom of the trench 65T. The third plane 523P3 may form an acute angle with respect to the first side surface 523S1 and the bottom of the trench 65T. The fourth plane 523P4 may be in contact with the second side surface 523S2 and the bottom of the trench 65T. The fourth plane 523P4 may form an acute angle with respect to the second side surface 523S2 and the bottom of the trench 65T.

A corner point 523V1 at which the first plane 523P1, the second plane 523P2, the third plane 523P3, and the fourth plane 523P4 meet may have a structure depressed toward the interior of the active region 523. The first plane 523P1 and the second plane 523P2 may meet to form a first edge 523E1, the first plane 523P1 and the third plane 523P3 may meet to form a second edge 523E2, the second plane 523P2 and the fourth plane 523P4 may meet to form a third edge 523E3, and the third plane 523P3 and the fourth plane 523P4 may meet to form a fourth 523E4.

The first plane 523P1, the first side surface 523S1, and the upper surface 523S4 may meet to form a second corner point 523V2, the first plane 523P1, the second plane 523P2, and the upper surface 523S4 may meet to form a third corner point 523V3, the second plane 523P2, the second side surface 523S2, and the upper surface 523S4 may meet to form a fourth corner point 523V4, the first plane 523P1, the first side surface 523S1, and the third plane 523P3 may meet to form a fifth corner point 523V5, the second plane 523P2, the second side surface 523S2, and the fourth plane 523P4 may meet to form a sixth corner point 523V6, the third plane 523P3, the first side surface 523S1, the bottom of the trench 65T may meet to form a seventh corner point 523V7, the third plane 523P3, the fourth plane 523P4, and the bottom of the trench 65T may meet to form an eighth corner point 523V8, and the fourth plane 523P4, the second side surface 523S2, and the bottom of the trench 65T may meet to form a ninth corner point 523V9.

Each of the strain-inducing patterns 575 may include a first side surface 575S1, a second side surface 575S2, a third side surface 575S3, and an upper surface 575S4. The second side surface 575S2 may be opposite the first side surface 575S1. The third side surface 575S3 may be in contact with the first side surface 575S1, the second side surface 575S2, and the upper surface 575S4. The upper surface 575S4 of the strain-inducing pattern 575 may have {100} surface which is the same as the upper surface 523S4 of the active region 523. Each of the first side surface 575S1 and the second side surface 575S2 may have {100} surface.

The third side surface 575S3 may include a first plane 575P1, a second plane 575P2, a third plane 575P3, and a fourth plane 575P4. Each of the first plane 575P1, the second plane 575P2, the third plane 575P3, and the fourth plane 575P4 may have {111} surface. The first plane 575P1 may be in contact with the first side surface 575S1 and the upper surface 575S4. The first plane 575P1 may form an obtuse angle with respect to each of the first side surface 575S1 and the upper surface 575S4. The second plane 575P2 may be in contact with the second side surface 575S2 and the upper surface 575S4. The second plane 575P2 may form an obtuse angle with respect to each of the second side surface 575S2 and the upper surface 575S4. The third plane 575P3 may be in contact with the first side surface 575S1 and a bottom of the strain-inducing pattern 575. The third plane 575P3 may form an obtuse angle with respect to the first side surface 575S1 and the bottom of the strain-inducing pattern 575. The fourth plane 575P4 may be in contact with the second side surface 575S2 and the bottom of the strain-inducing pattern 575. The fourth plane 575P4 may form an obtuse angle with respect to the second side surface 575S2 and the bottom of the strain-inducing pattern 575.

Each of the strain-inducing patterns 575 may be in contact with the active region 523. A corner point 575V1 at which the first plane 575P1, second plane 575P2, third plane 575P3, and fourth plane 575P4 of the strain-inducing pattern 575 meet may be referred to as a Chrysler building-tip. The first plane 575P1, second plane 575P2, third plane 575P3, and fourth plane 575P4 of the strain-inducing pattern 575 may be referred as a Chrysler building-shape.

Referring to FIG. 31, the substrate 521 may be a semiconductor substrate such as a silicon wafer or SOI wafer having {100} surface. The substrate 521 may include a notch 521N formed in <100> direction. A major axis of the active region 523 may be arranged in <100> direction. The gate electrode 594 may cross the active region 523.

Figure 32:
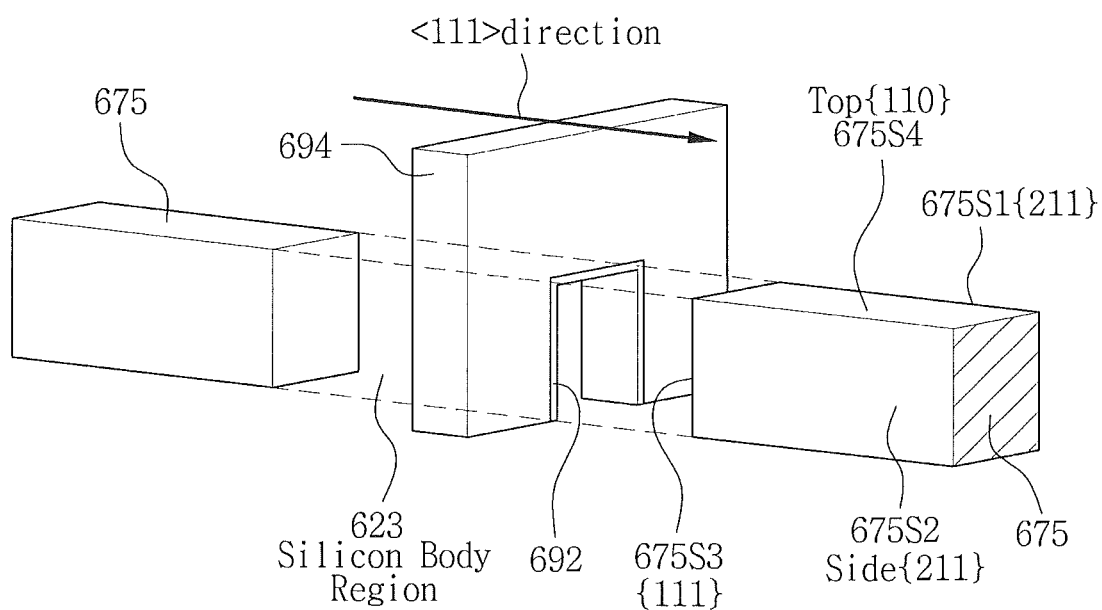
FIG. 32 is a perspective view describing a three-dimensional semiconductor device in accordance with embodiments of the inventive concept.
Figure 33:
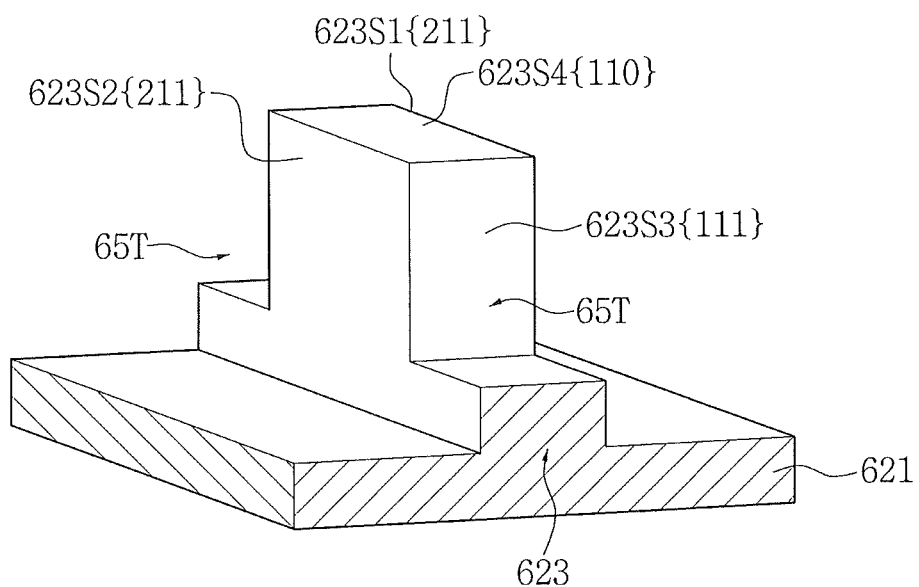
FIG. 33 is an enlarged view showing a part of FIG. 32.
Figure 34:
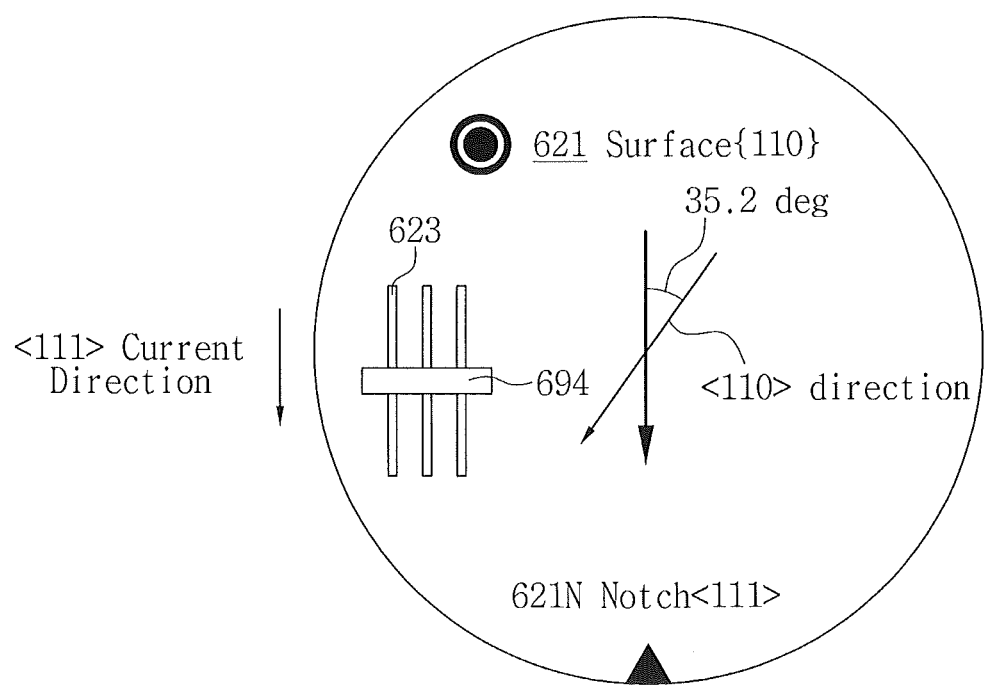
FIG. 34 is a layout view applicable to embodiments of FIG. 32.

FIG. 32 is a perspective view describing a three-dimensional semiconductor device in accordance with embodiments of the inventive concept, FIG. 33 is an enlarged view showing a part of FIG. 32 in detail, and FIG. 34 is a layout view applicable to embodiments of FIG. 32.

Referring to FIG. 33, an active region 623 may be confined within a substrate 621. A gate electrode 694 may be formed across the active region 623. Trenches 65T may be formed in the active region 623 adjacent to both sides of the gate electrode 694. Strain-inducing patterns 675T may be formed in the trenches 65T. A gate dielectric layer 692 may be formed between the gate electrode 694 and the active region 623. The gate electrode 694 may cover sides of the active region 623.

A major axis of the active region 623 may be arranged in <111> direction. The active region 623 may include a first side surface 623S1, a second side surface 623S2, a third side surface 623S3, and an upper surface 623S4. The second side surface 623S2 may be opposite the first side surface 623S1. The third side surface 623S3 may be in contact with the first side surface 623S1, the second side surface 623S2, and the upper surface 623S4. The upper surface 623S4 of the active region 623 may have {110} surface. Each of the first side surface 623S1 and the second side surface 623S2 may have {211} surface. The third side surface 623S3 may have {111} surface formed by a directional etching process. The third side surface 623S3 may be perpendicular to the upper surface 623S4. The third side surface 623S3 may be perpendicular to the first side surface 623S1 and the second side surface 623S2. The third side surface 623S3 may be perpendicular to a surface of the substrate 621.

The strain-inducing patterns 675 may be referred to as an embedded stressor. Each of the strain-inducing patterns 675 may include a first side surface 675S1, a second side surface 675S2, a third side surface 675S3, and an upper surface 675S4. The second side surface 675S2 may be opposite the first side surface 675S1. The third side surface 675S3 may be in contact with the first side surface 675S1, the second side surface 675S2, and the upper surface 675S4. The upper surface 675S4 of the strain-inducing pattern 675 may have {110} surface which is the same as the upper surface 623S4 of the active region 623. Each of the first side surface 675S1 and the second side surface 675S2 may have {211} surface. The third side surface 675S3 may have {111} surface. The third side surface 675S3 may be perpendicular to the upper surface 675S4. The third side surface 675S3 may be perpendicular to the first side surface 675S1 and the second side surface 675S2. The third side surface 675S3 may be perpendicular to the surface of the substrate 621.

The third side surface 675S3 of the strain-inducing pattern 675 may be in direct contact with the third side surface 623S3 of the active region 623. The third side surface 675S3 of the strain-inducing pattern 675 may be interpreted as substantially the same interface as the third side surface 623S3 of the active region 623.

Referring to FIG. 34, the substrate 621 may be a semiconductor substrate such as a silicon wafer or SOI wafer having {110} surface. The substrate 621 may include a notch 621N formed in <111> direction. A major axis of the active region 623 may be arranged in <111> direction. The gate electrode 694 may cross the active region 623.

Figure 35:
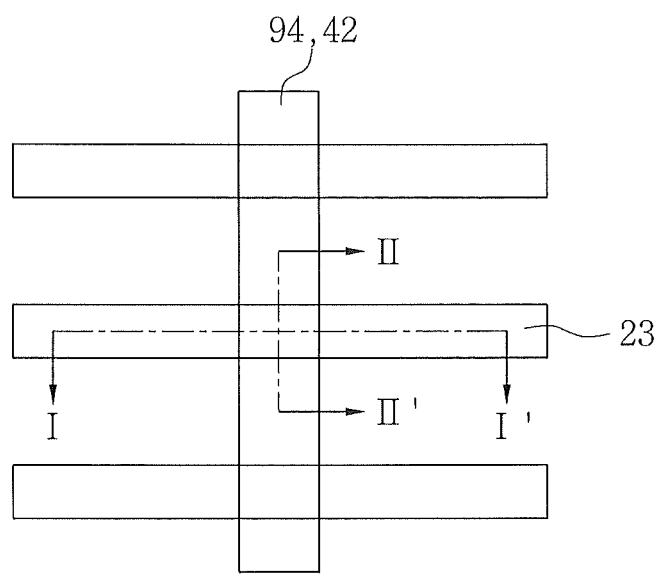
FIG. 35 is a layout view describing a three-dimensional semiconductor device in accordance with embodiments of the inventive concept.

FIG. 35 is a layout view describing a three-dimensional semiconductor device in accordance with embodiments of the inventive concept, FIGS. 36 to 47 show cross-sectional views taken along lines I-I and for describing a method of forming a semiconductor device in accordance with embodiments of the inventive concept.

Figure 36:
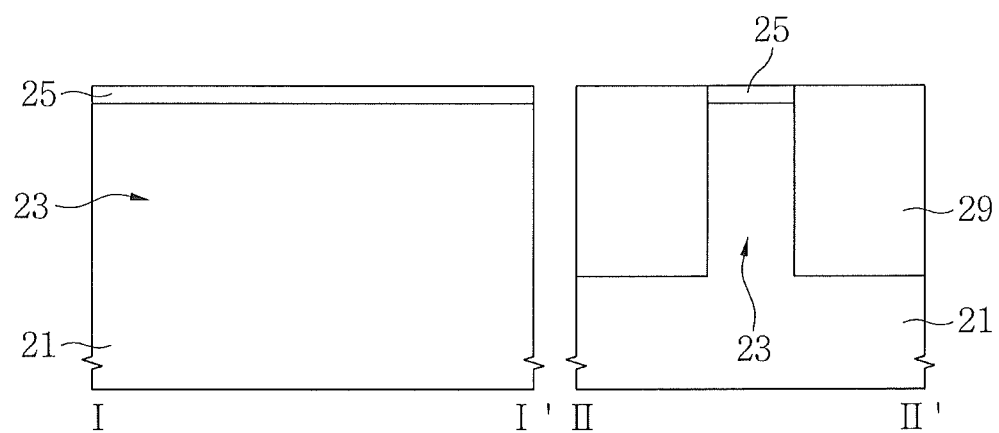
FIGS. 36 to 47 are cross-sectional views describing a method of forming a semiconductor device in accordance with embodiments of the inventive concept.

Referring to FIGS. 35 and 36, a device isolation region 29 confining an active region 23 may be formed in a substrate 21. An upper surface of the active region 23 may be covered by a buffer layer 25.

The substrate 21 may be a semiconductor substrate such as a silicon wafer or SOI wafer. For example, the substrate 21 may include a single crystalline silicon having p-type impurities. The active region 23 may have various shapes such as a fin shape or a wire shape. For example, the active region 23 may include fin-shaped single crystalline silicon in which a major axis is formed to be relatively long. The active region 23 may be formed considering a wafer orientation appropriate for the application embodiments described with reference to FIG. 1 to FIG. 34. The device isolation region 29 may be formed using shallow trench isolation (STI) technology. The device isolation region 29 may include an insulating layer such as silicon oxide, silicon nitride, silicon oxynitride, or a combination thereof. The buffer layer 25 may include an insulating layer such as silicon oxide, silicon nitride, silicon oxynitride, or a combination thereof.

Figure 37:
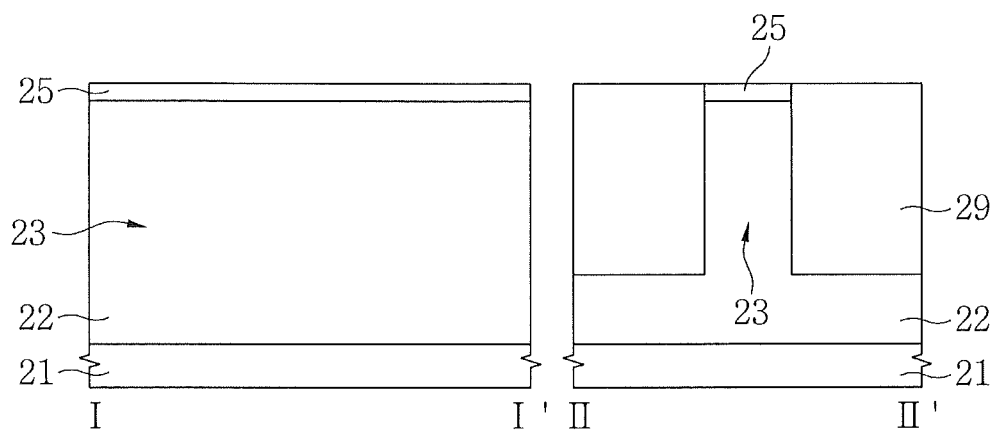

Referring to FIGS. 35 and 37, an n-well region 22 may be formed in the predetermined region of the substrate 21. The active region 23 may be confined to the n-well 22. Channel ions may be implanted into the active region 23. The n-well 22 may be formed by implanting impurities having a different conductivity type from the substrate 21. For example, the n-well 22 may be formed by implanting n-type impurities to a predetermined depth position from a surface of the substrate 21.

In some embodiments, the n-well 22 may be formed before forming the device isolation region 29. In another embodiment, the n-well 22 may be omitted.

Figure 38:
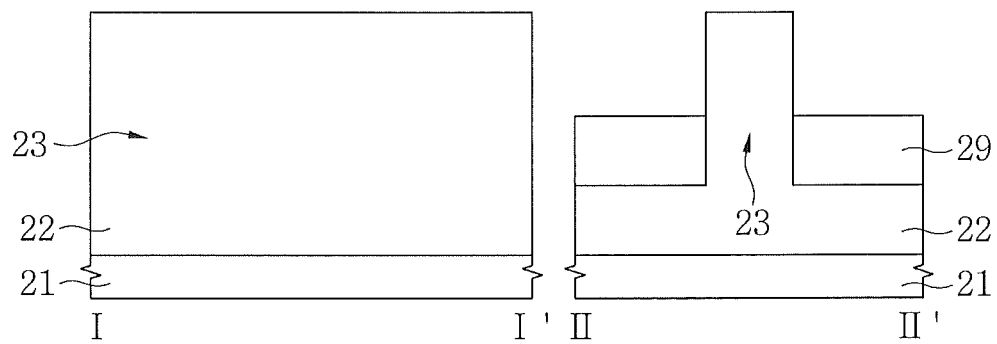

Referring to FIGS. 35 and 38, the device isolation region 29 may be recessed, and therefore, sides of the active region 23 may be exposed. The device isolation region 29 may be located at a lower level than an upper end of the active region 23. During the device isolation region 29 being recessed, the buffer layer 25 may also be removed. An upper surface of the active region 23 may be exposed. An etchback process may be applied to recess of the device isolation region 29.

Figure 39:
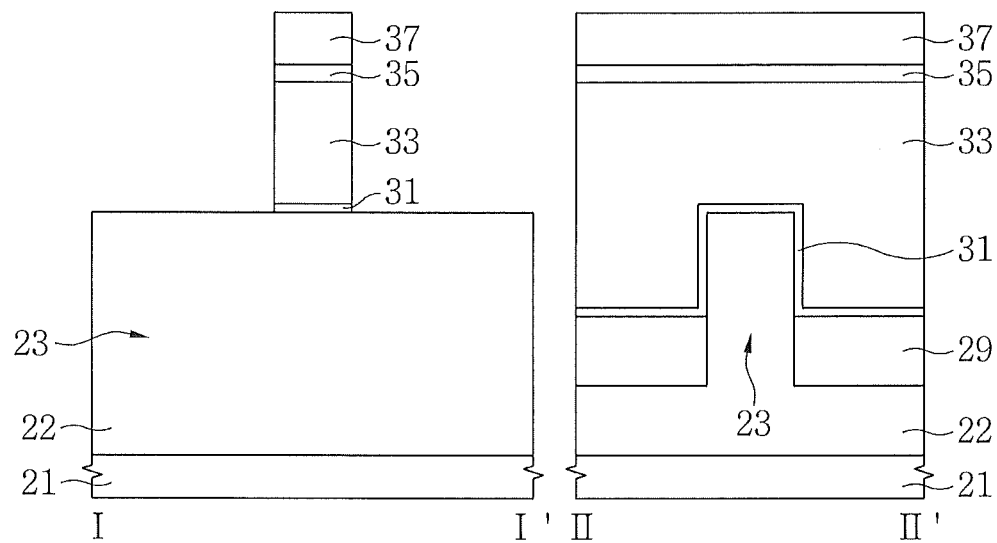

Referring to FIGS. 35 and 39, a temporary gate dielectric layer 31, a temporary gate electrode 33, a buffer pattern 35, and a mask pattern 37 may be formed in active region 23. The buffer pattern 35 and the mask pattern 37 may configure a hardmask pattern. The temporary gate electrode 33 may be formed using a thin film formation process, a CMP process, and a patterning process.

The temporary gate electrode 33 may cross the active region 23. The temporary gate electrode 33 may cover side and upper surfaces of the active region 23. The temporary gate dielectric layer 31 may be formed between the active region 23 and the temporary gate electrode 33. The temporary gate dielectric layer 31 may include an insulating layer such as silicon oxide, silicon nitride, silicon oxynitride, or a combination thereof. The temporary gate electrode 33 may include polysilicon. The buffer pattern 35 may include silicon oxide. The mask pattern 37 may include silicon nitride.

Figure 40:
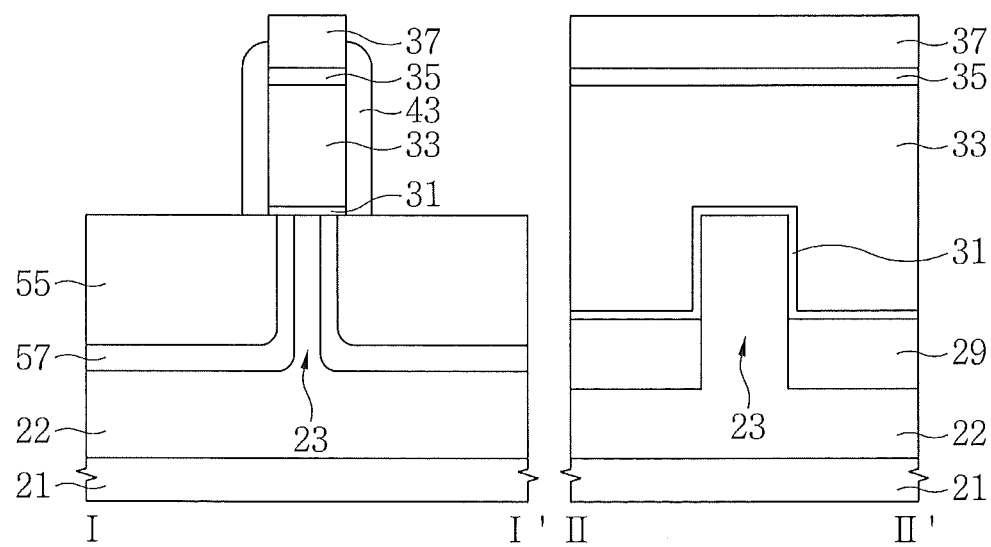

Referring to FIGS. 35 and 40, spacers 43 may be formed on sides of the temporary gate electrode 33. LDDs 55 and halos 57 may be formed in the active region 23.

The spacers 43 may cover sides of the temporary gate electrode 33, buffer pattern 35, and mask pattern 37. The spacers 43 may include an insulating layer such as silicon oxide, silicon nitride, silicon oxynitride, or a combination thereof. For example, the spacers 43 may be silicon nitride. The spacers 43 may be formed by sequentially stacking silicon oxide and silicon nitride.

The LDDs 55 and the halos 57 may be formed using the mask pattern 37 and the spacers 43 as a mask for ion implantation. The LDDs 55 may be formed in the active region 23 adjacent to an outer side of the temporary gate electrode 33. The LDDs 55 may diffuse under the spacers 43. The LDDs 55 may include impurities having a different conductivity type from the n-well 22. The LDDs 55 may include p-type impurities.

The halos 57 may be formed in outsides of the LDDs 55. The halos 57 may cover bottoms and sides of the LDDs 55. For example, the halos 57 may be formed to surround the LDDs 55. The halos 57 may include impurities having a different conductivity type from the LDDs 55, and the halos 57 may include impurities having the same conductivity type as the n-well 22. For example, the halos 57 may include n-type impurities. Concentration of n-type impurities of the halos 57 may be higher than that of the n-well 22.

Figure 41:
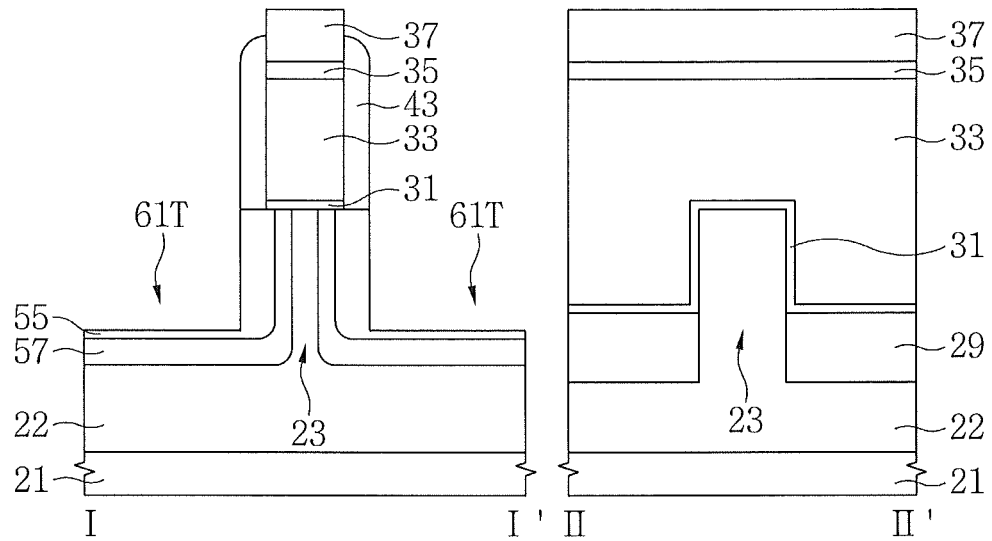

Referring to FIGS. 35 and 41, preliminary trenches 61T may be formed by performing a first etch to the active region 23.

The preliminary trenches 61T may be formed by an anisotropic etching process, an isotropic etching process, or a combination thereof. For example, the preliminary trenches 61T may be formed by the anisotropic etching process using the mask pattern 37 and the spacers 43 as an etch mask and using HBr, $CF_4$, $O_2$, $Cl_2$, $NF_3$, or a combination thereof. The preliminary trenches 61T may be aligned to outer sides of the spacers 43. Each of the preliminary trenches 61T may have a U-shape. The active region 23 may be exposed in sidewalls of the preliminary trenches 61T.

Figure 42:
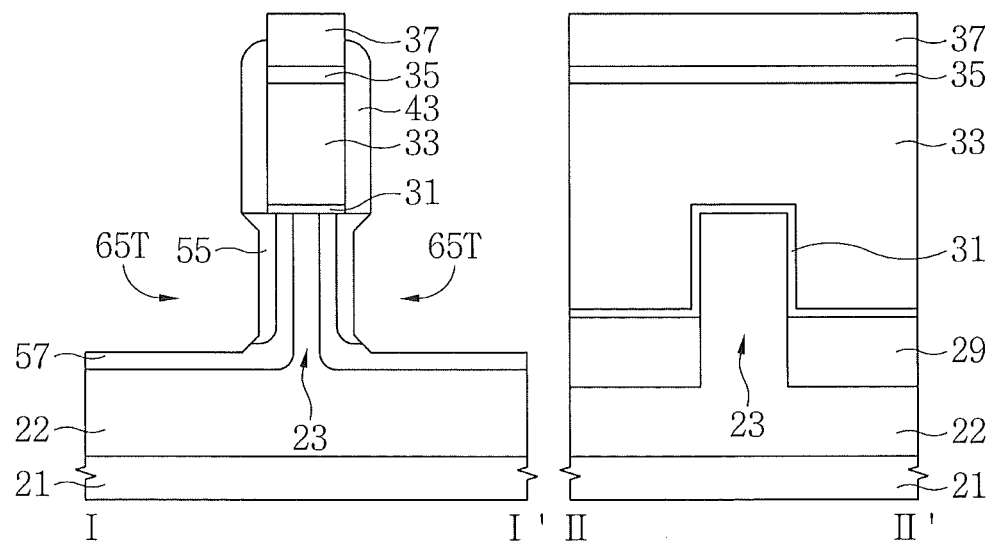

Referring to FIGS. 35 and 42, trenches 65T may be formed by performing a second etch to the active region 23. The trenches 65T may be referred to as a cavity. The trenches 65T and the active region 23 may be formed in various shapes as described with reference to FIGS. 1 to 34.

The second etch of the active region 23 may be performed by a directional etching process. The directional etching process may be performed using $NH_4OH$, $NH_3OH$, Tetra Methyl Ammonium Hydroxide (TMAH), KOH, NaOH, benzyl trimethyl ammonium hydroxide (BTMH), or a combination thereof. The directional etching process may have different etch rate depending on crystal orientation of the active region 23. The directional etching process may have high etch rate with respect to $\{100\}$ surface and $\{110\}$ surface of the active region 23. The directional etching process may have significantly low etch rate with respect to $\{111\}$ surface of the active region 23. The directional etching process may be substantially halted at $\{111\}$ surface of the active region 23.

Figure 43:
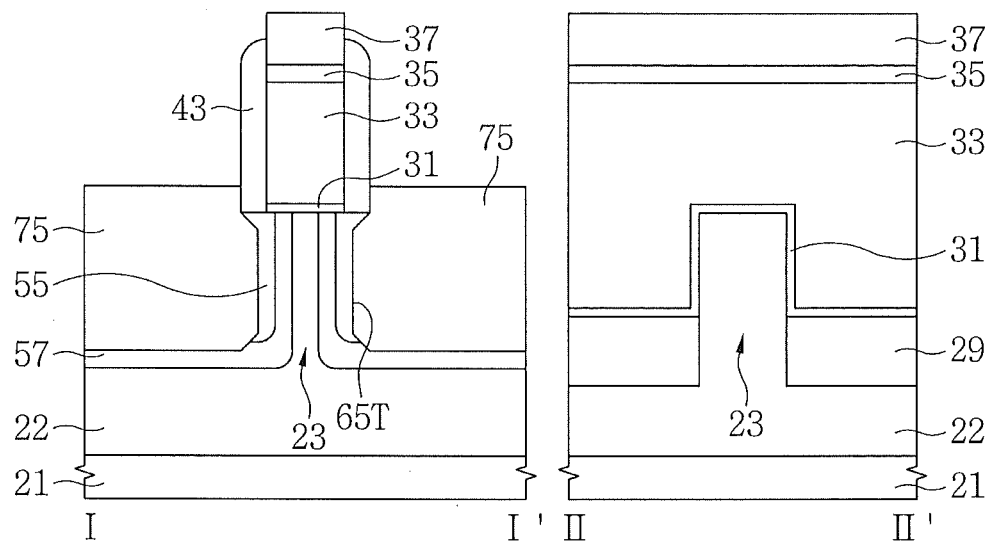

Referring to FIGS. 35 and 43, a strain-inducing pattern 75 may be formed in the trenches 65T. The strain-inducing pattern 75 may be referred to as an embedded stressor. The strain-inducing pattern 75 may be formed in various shapes as described with reference to FIGS. 1 to 34.

The strain-inducing pattern 75 may include a single crystalline semiconductor layer formed by selective epitaxial growth (SEG) technology. For example, the strain-inducing pattern 75 may include SiGe. The strain-inducing pattern 75 may cover inner walls of the trenches 65T. The strain-inducing pattern 75 may be in direct contact with the LDDs 55 and the halos 57. The strain-inducing pattern 75 may fully fill the trenches 65T and protrude to a higher level than the active region 23. The strain-inducing pattern 75 may include p-type impurities. For example, the strain-inducing pattern 75 may include boron (B). Concentration of p-type impurities in the strain-inducing pattern 75 may be higher than the LDDs 55.

In another embodiment, the strain-inducing pattern 75 may include SiC.

Figure 44:
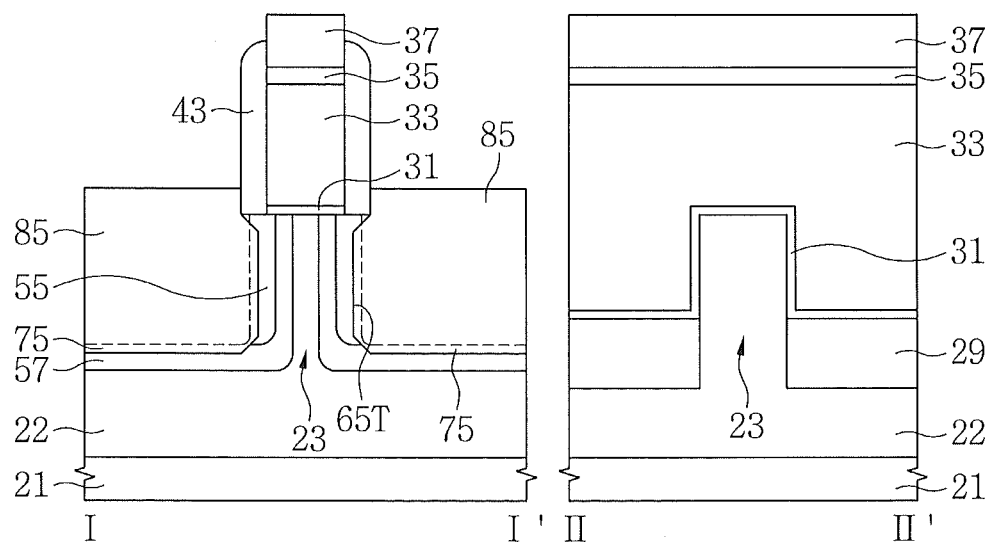

Referring to FIGS. 35 and 44, P-source/drain 85 areas may be formed using the mask pattern 37 and the spacers 43 as a mask for ion implantation. The P-source/drain areas 85 may include p-type impurities. The P-source/drain areas 85 may be formed in an upper portion of the strain-inducing pattern 75. The P-source/drain areas 85 may extend to a part of the LDDs 55 close to the strain-inducing pattern 75.

Figure 45:
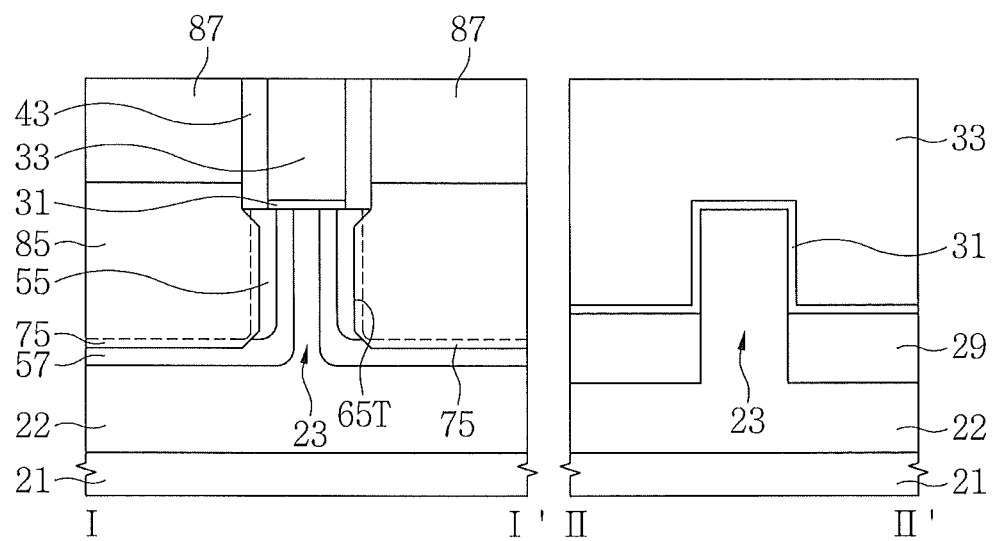

Referring to FIGS. 35 and 45, an interlayer insulating layer 87 covering the overall substrate 21 may be formed. An upper surface of the temporary gate electrode 33 may be exposed by planarizing the interlayer insulating layer 87. The planarization of the interlayer insulating layer 87 may be performed by a CMP process. During the planarization of the interlayer insulating layer 87, the mask pattern 37 and the buffer pattern 35 may be removed.

Figure 46:
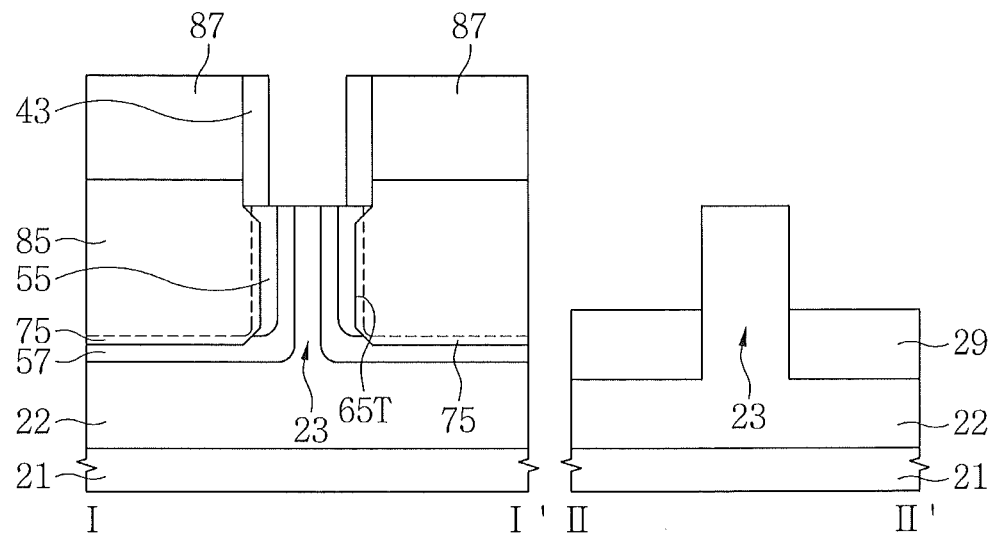

Referring to FIGS. 35 and 46, upper and side surfaces of the active region 23 may be exposed by removing the temporary gate electrode 33 and the temporary gate dielectric layer 31.

Figure 47:
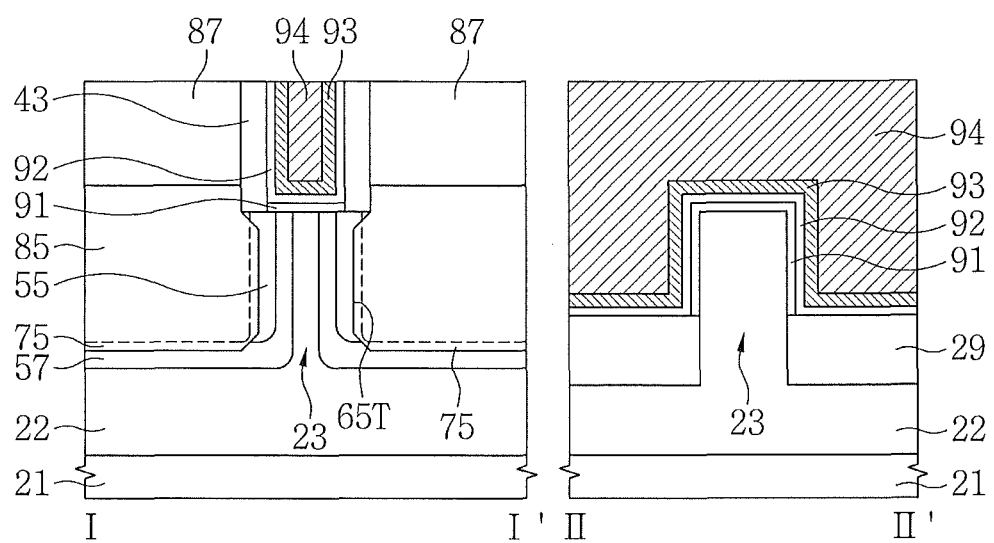

Referring to FIGS. 35 and 47, a first gate dielectric layer 91 may be formed on the exposed upper and side surfaces of the active region 23. A second gate dielectric layer 92 may be formed on the first gate dielectric layer 91. First and second gate electrodes 93 and 94 may be formed on the second gate dielectric layer 92. The first and second gate electrodes 93 and 94 may cover the upper and side surfaces of the active region 23.

The first gate dielectric layer 91 may be referred to as an interfacial oxide layer. The first gate dielectric layer 91 may be formed using a cleaning process. The first gate dielectric layer 91 may include silicon oxide. The second gate dielectric layer 92 may include silicon oxide, silicon nitride, silicon oxynitride, a high-k dielectric layer, or a combination thereof. For example, the second gate dielectric layer 92 may include HfO or HfSiO. The second gate dielectric layer 92 may surround a side and bottom of a first gate electrode 93.

The first gate electrode 93 may surround a side and bottom of a second gate electrode 94. The first gate electrode 93 may include a conductive layer considering work-function. For example, the first gate electrode 93 may include TiN or TaN. The second gate electrode 94 may include a metal layer.

In another embodiment, the first gate electrode 93 may include TiAl or TiAlC.

FIGS. 48 to 54 are cross-sectional views taken along lines I-I' and II-II' in FIG. 35 for describing a method of forming a semiconductor device in accordance with embodiments of the inventive concept.

Figure 48:
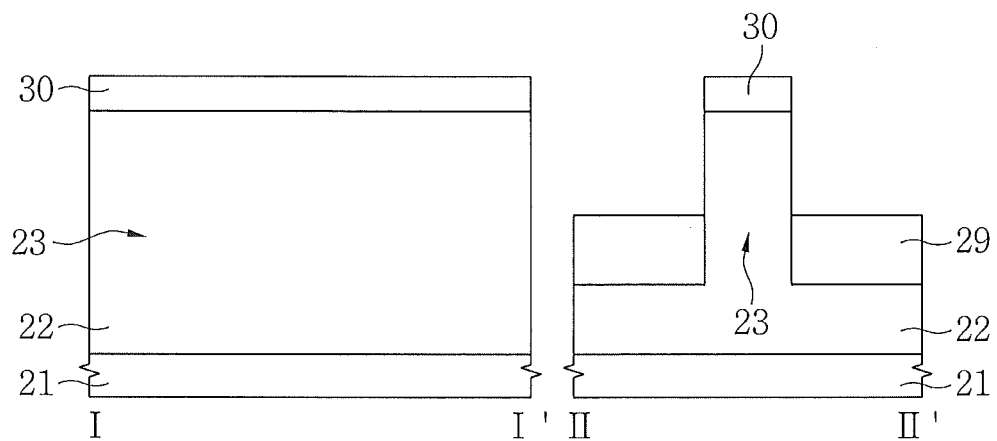
FIGS. 48 to 54 are cross-sectional views describing a method of forming a semiconductor device in accordance with embodiments of the inventive concept.

Referring to FIGS. 35 and 48, a device isolation region 29 confining an active region 23 may be formed in the substrate 21. The active region 23 may be confined to an n-well 22. An upper surface of the active region 23 may be covered by an insulating pattern 30, and sides of the active region 23 may be exposed. The device isolation region 29 may be retained at a lower level than an upper end of the active region 23. The insulating pattern 30 may include an insulating layer such as silicon oxide, silicon nitride, silicon oxynitride, or a combination thereof.

Figure 49:
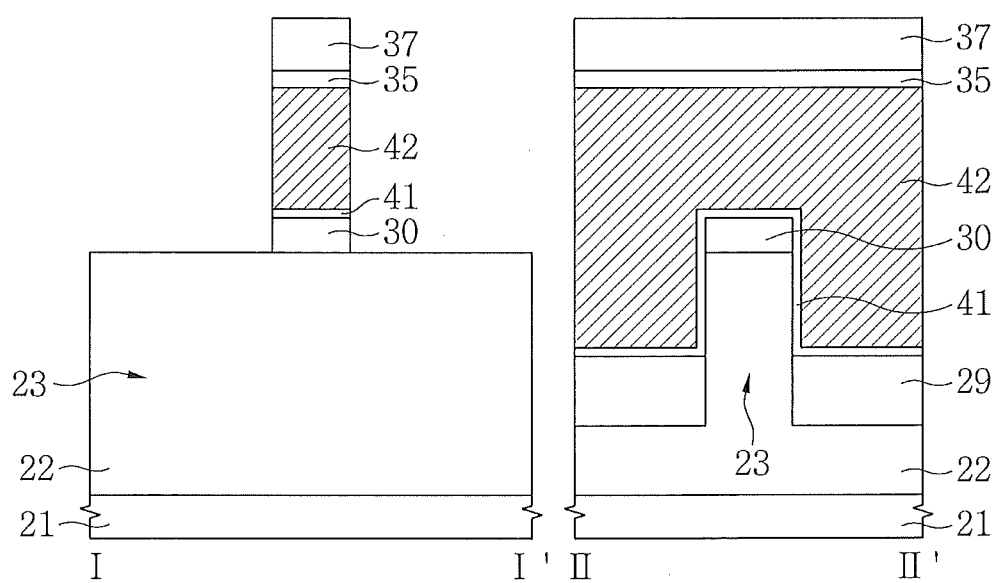

Referring to FIGS. 35 and 49, a gate dielectric layer 41, a gate electrode 42, a buffer pattern 35, and a mask pattern 37 may be formed on the active region 23. The gate dielectric layer 41 may cover sides of the active region 23 and the insulating pattern 30. The gate electrode 42 may cover side and upper surfaces of the active region 23. The gate dielectric layer 41 may be interposed between the gate electrode 42 and the active region 23. The insulating pattern 30 may be retained between the gate dielectric layer 41 and the upper surface of the active region 23.

The gate dielectric layer 41 may include an insulating layer such as silicon oxide, silicon nitride, silicon oxynitride, high-k dielectric layer, or a combination thereof. The gate electrode 42 may include a conductive material such as polysilicon, a metal, a metal silicide, a conductive carbon, or a combination thereof.

Figure 50:
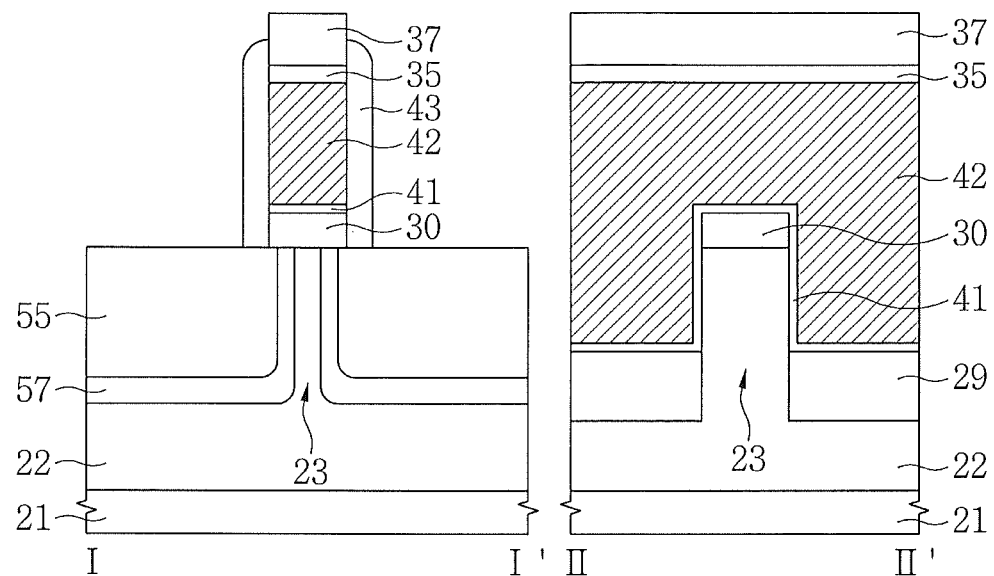

Referring to FIGS. 35 and 50, spacers 43 may be formed on sides of the gate electrode 42. LDDs 55 and halos 57 may be formed on the active region 23.

Figure 51:
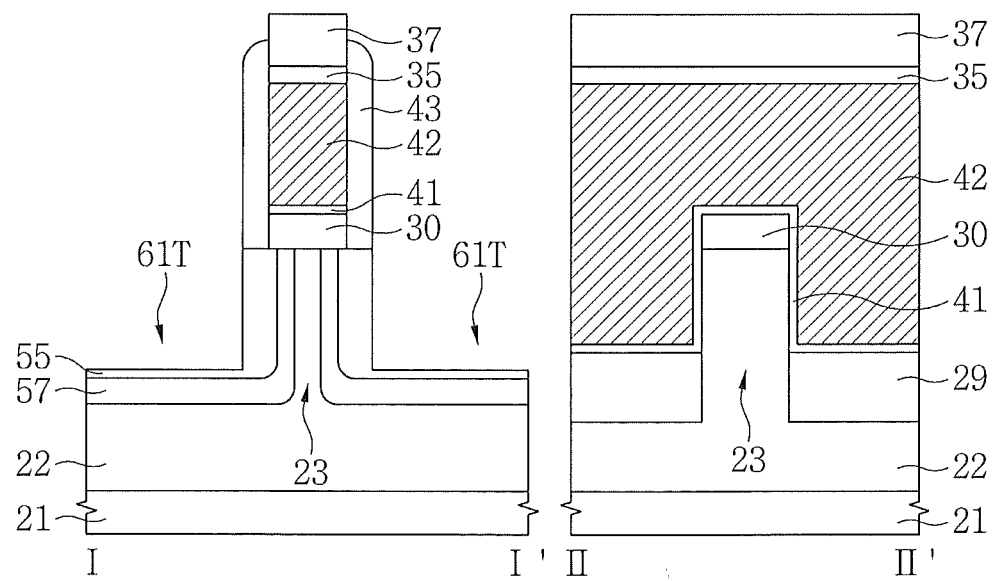

Referring to FIGS. 35 and 51, preliminary trenches 61T may be formed by performing a first etch to the active region 23.

Figure 52:
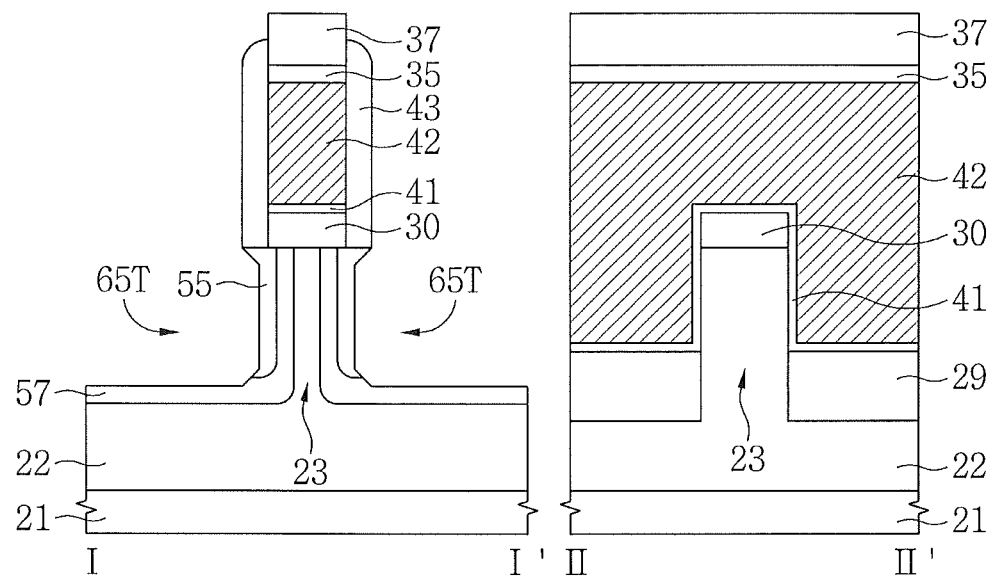

Referring to FIGS. 35 and 52, trenches 65T may be formed by performing a second etch to the active region 23. The trenches 65T may be referred to as a cavity. The trenches 65T and the active region 23 may be formed in various shapes as described with reference to FIGS. 1 to 34.

Figure 53:
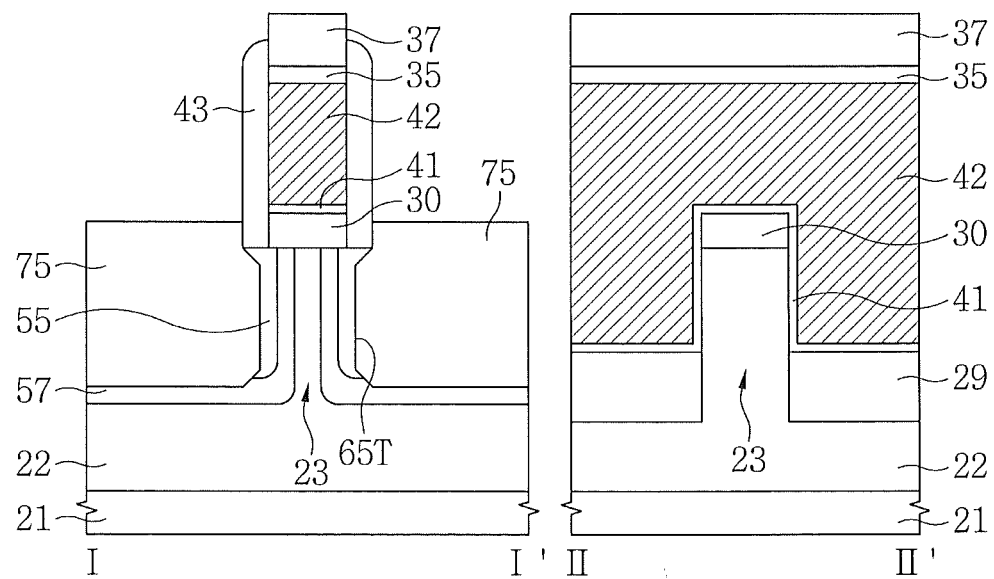

Referring to FIGS. 35 and 53, a strain-inducing pattern 75 may be formed in the trenches 65T. The strain-inducing pattern 75 may be referred to as an embedded stressor. The strain-inducing pattern 75 may be formed in various shapes as described with reference to FIGS. 1 to 34.

Figure 54:
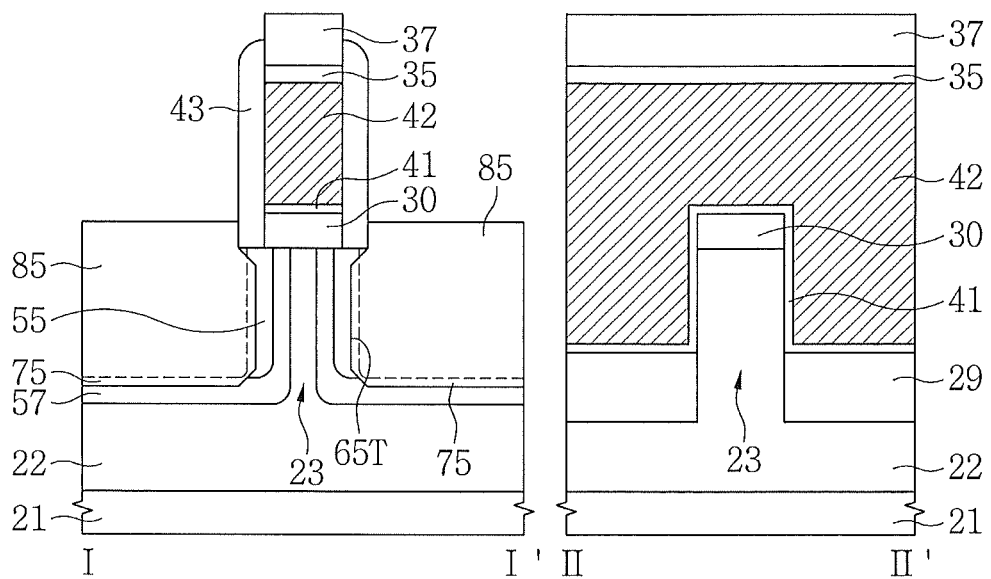

Referring to FIGS. 35 and 54, P-source/drain areas 85 may be formed using the mask pattern 37 and the spacers 43 as a mask for ion implantation.

FIGS. 55 to 58 are cross-sectional views taken along lines I-I' and II-II' in FIG. 35 for describing a method of forming a semiconductor device in accordance with embodiments of the inventive concept.

Figure 55:
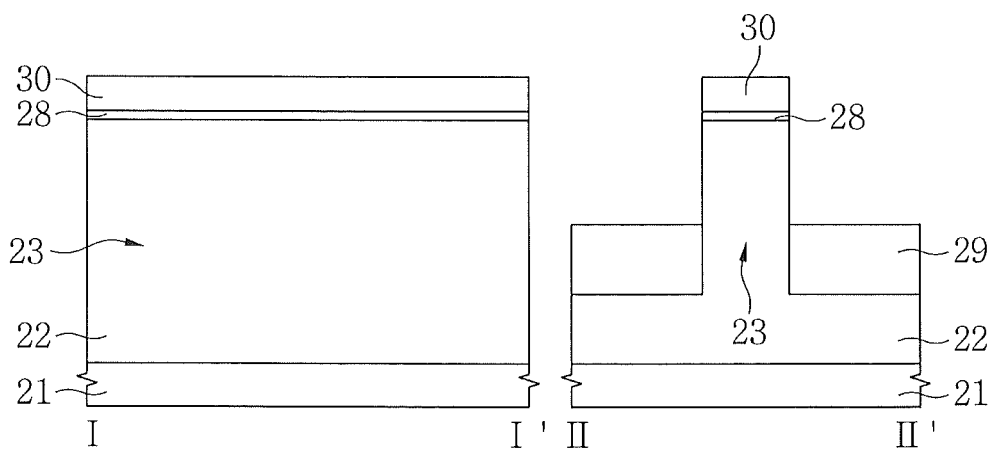
FIGS. 55 to 58 are cross-sectional views describing a method of forming a semiconductor device in accordance with embodiments of the inventive concept.

Referring to FIGS. 35 and 55, a device isolation region 29 confining an active region 23 may be formed in a substrate 21. The active region 23 may be confined to an n-well 22. An upper surface of the active region 23 may be covered by first and second insulating patterns 28 and 30, and side surfaces of the active region 23 may be exposed. The device isolation region 29 may be retained at a lower level than the upper surface of the active region 23. The first and second insulating pattern 28 and 30 may include an insulating layer such as silicon oxide, silicon nitride, silicon oxynitride, or a combination thereof. The first and second insulating patterns 28 and 30 may include a different material from each other. For example, the first insulating pattern 28 may include silicon oxide, and the second insulating pattern 30 may include silicon nitride.

Figure 56:
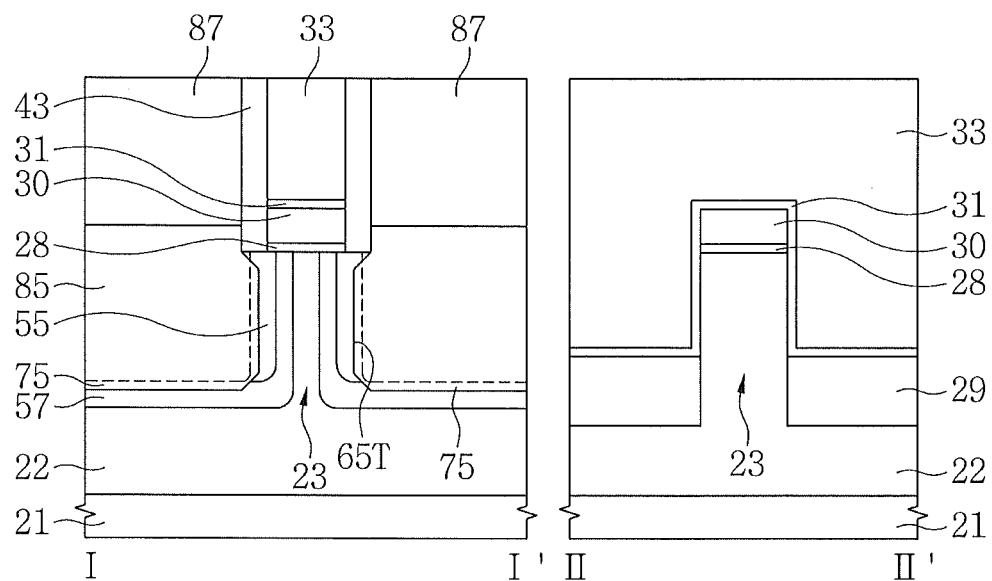

Referring to FIGS. 35 and 56, a temporary gate dielectric layer 31 and a temporary gate electrode 33 may be formed in the active region 23. Spacers 43T may be formed on sides of the temporary gate electrode 33. LDDs 55 and halos 57 may be formed in the active region 23. The active region 23 may be etched to form trenches 65T. A strain-inducing pattern 75 may be formed in the trenches 65T. P-source/drain areas 85 may be formed in the strain-inducing pattern 75. An interlayer insulating layer 87 covering the overall substrate 21 may be formed. An upper surface of the temporary gate electrode 33 may be formed by planarizing the interlayer insulating layer 87.

The first and second insulating patterns 28 and 30 may be retained between the upper surface of the active region 23 and the temporary gate dielectric layer 31.

Figure 57:
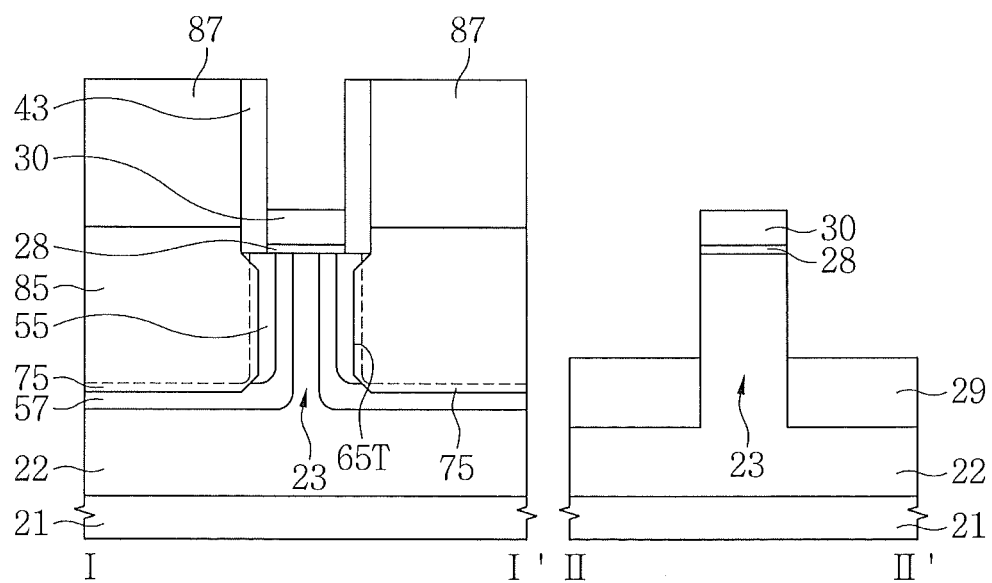

Referring to FIGS. 35 and 57, sidewalls of the active region 23 may be exposed by removing the temporary gate electrode 33 and the temporary gate dielectric layer 31. The first and second insulating patterns 28 and 30 may be retained on the upper surface of the active region 23.

Figure 58:
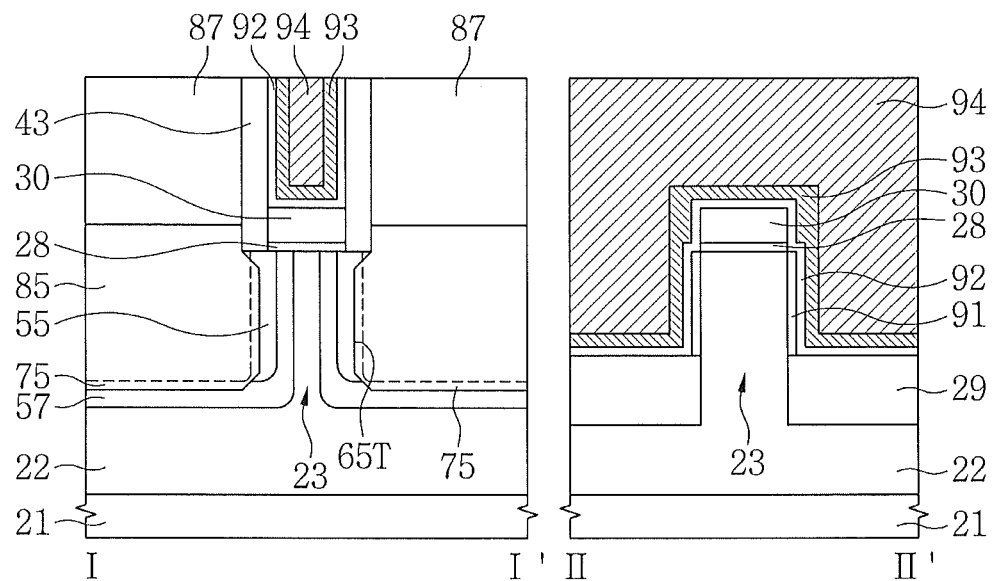

Referring to FIGS. 35 and 58, a first gate dielectric layer 91 may be formed on sides of the exposed active region 23. A second gate dielectric layer 92 may be formed on the first gate dielectric layer 91. The second gate dielectric layer 92 may cover the first gate dielectric layer 91, and the first and second insulating patterns 28 and 30. First and second gate electrodes 93 and 94 may be formed on the second gate dielectric layer 92.

As described above, the strain-inducing pattern 75 may include a different material from the active region 23. For example, a semiconductor device in accordance with an embodiment of the inventive concept may be a PMOS transistor in which the active region 23 includes single crystalline silicon, and the strain-inducing pattern 75 includes SiGe. In addition, the active region 23 may include Ge or a group III-V compound semiconductor.

In an application embodiment, when the substrate 21 is an SOI wafer, the active region 23 may be a semiconductor pattern formed on a buried oxide layer.

In another embodiment, the semiconductor device in accordance with an embodiment of the inventive concept may be an NMOS transistor in which the active region 23 includes single crystalline silicon, and the strain-inducing pattern 75 includes SiC.

Figure 59:
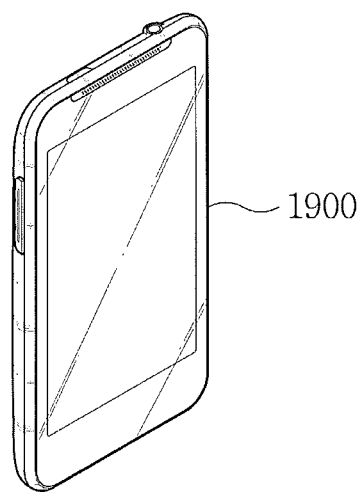
FIGS. 59 and 60 are respectively, a perspective view and a system block diagram describing an electronic apparatus in accordance with an embodiment of the inventive concept.
Figure 60:
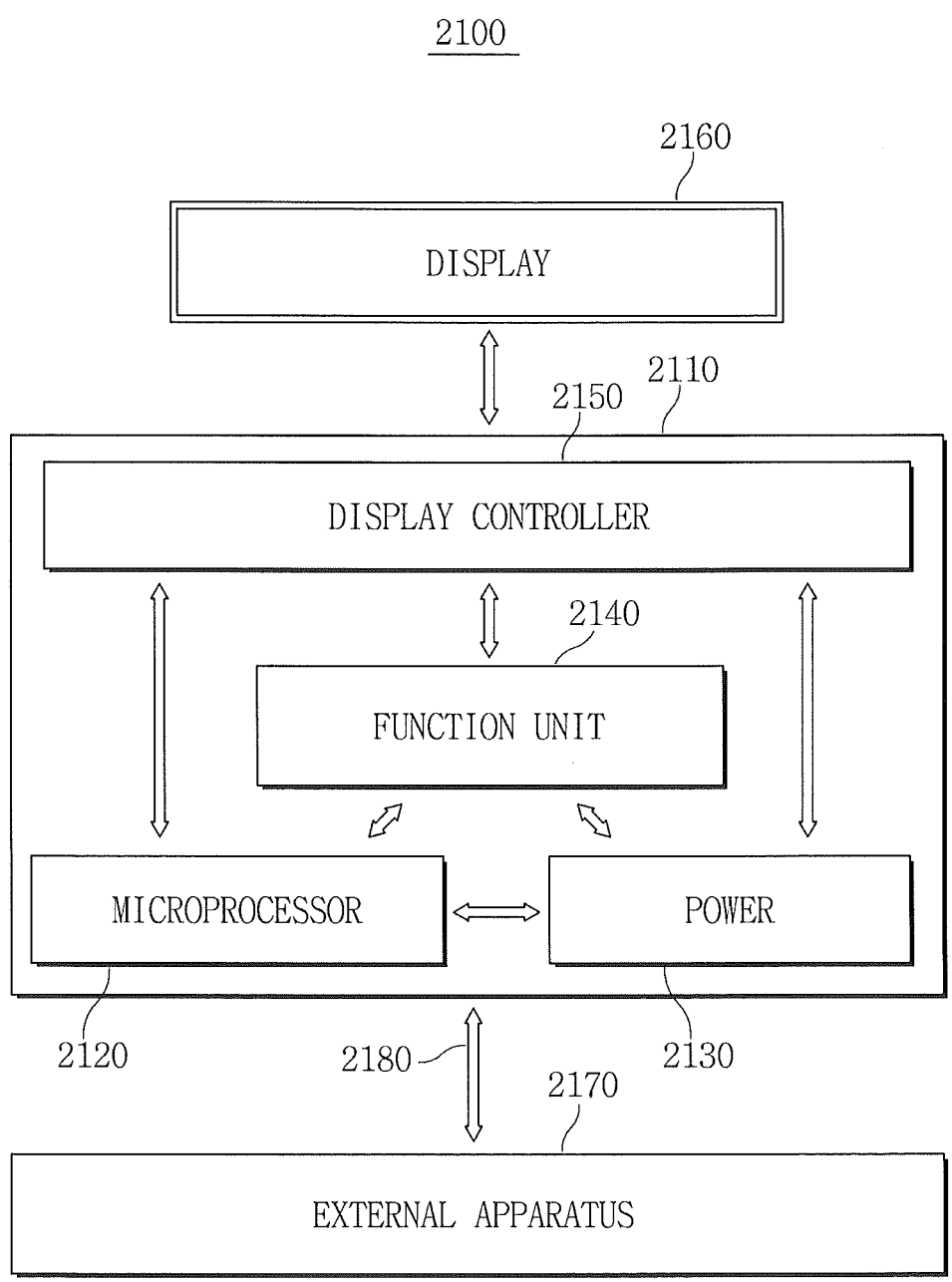

FIGS. 59 and 60 are respectively, a perspective view and a system block diagram of an electronic apparatus in accordance with an embodiment of the inventive concept.

Referring to FIG. 59, the semiconductor device as described with reference to FIGS. 1 to 58 may be usefully applied to electronic systems such as a mobile phone 1900, a netbook, a notebook, or a tablet PC. For example, the semiconductor device as described with reference to FIGS. 1 to 58 may be installed in a main board inside the mobile phone 1900. Further, the semiconductor device as described with reference to FIGS. 1 to 58 may be provided to an expansion apparatus such as an external memory card, to be used combined with the mobile phone 1900

Referring to FIG. 60, the semiconductor device as described with reference to FIGS. 1 to 58 may be applied to an electronic system 2100. The electronic system 2100 may include a body 2110, a microprocessor unit 2120, a power unit 2130, a function unit 2140, and a display controller unit 2150. The body 2110 may be a mother board formed of a printed circuit board (PCB). The microprocessor unit 2120, the power unit 2130, the function unit 2140, and the display controller unit 2150 may be installed on the body 2110. A display unit 2160 may be installed inside or outside of the body 2110. For example, the display unit 2160 may be disposed on a surface of the body 2110 to display an image processed by the display controller unit 2150.

The power unit 2130 may function to receive a constant voltage from an external battery (not shown), divide the voltage into required levels, and supply those voltages to the microprocessor unit 2120, the function unit 2140, and the display controller unit 2150. The microprocessor unit 2120 may receive the voltage from the power unit 2130 to control the function unit 2140 and the display unit 2160. The function unit 2140 may perform functions of various electronic systems 2100. For example, if the electronic system 2100 is a mobile phone, the function unit 2140 may have several components which can perform functions of a mobile phone such as dialing, video output to the display unit 2160 through communication with the external apparatus 2170, and sound output to a speaker, and if a camera is installed, the function unit 2140 may function as a camera image processor.

In the embodiment to which the inventive concept is applied, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. Further, when the electronic system 2100 needs a universal serial bus (USB) in order to expand functionality, the function unit 2140 may function as an interface controller. In addition, the function unit 2140 may include a mass storage device.

The semiconductor device as described with reference to FIGS. 1 to 58 may be applied to the function unit 2140 or the microprocessor unit 2120. For example, the microprocessor unit 2120 may include the strain-inducing pattern 75.

Figure 61:
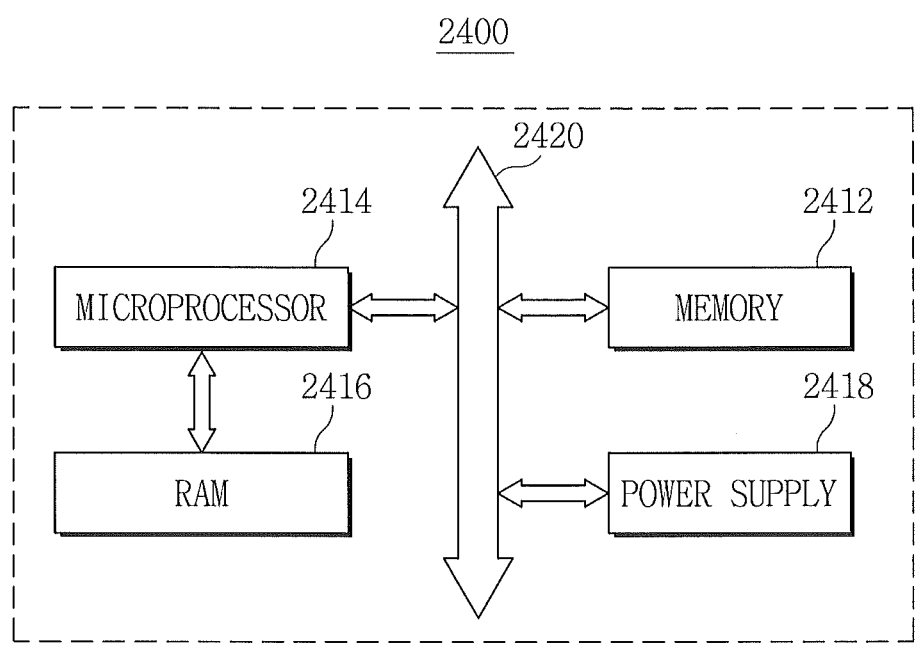
FIG. 61 is a system block diagram describing an electronic apparatus in accordance with an embodiment of the inventive concept.

FIG. 61 is a block diagram schematically illustrating another electronic system 2400 including at least one of semiconductor devices in accordance with embodiments of the inventive concept.

Referring to FIG. 61, the electronic system 2400 may include at least one of semiconductor devices in accordance with embodiments of the inventive concept. The electronic system 2400 may be used to fabricate a mobile apparatus or a computer. For example, the electronic system 2400 may include a memory system 2412, a microprocessor 2414, a RAM 2416, and a power supply 2418. The microprocessor 2414 may program and control the electronic system 2400. The RAM 2416 may be used as an operational memory of the microprocessor 2414. The microprocessor 2414, the RAM 2416, and/or other components may be assembled in a single package. The memory system 2412 may store code for operating the microprocessor 2414, data processed by the microprocessor 2414, or external input data. The memory system 2412 may include a controller and a memory.

The semiconductor device as described with reference to FIGS. 1 to 58 can be applied to the microprocessor 2414, the RAM 2416, or the memory system 2412. For example, the microprocessor 2414 may include the strain-inducing pattern 75.

In accordance with the embodiments of the inventive concept, a strain-inducing pattern filling a trench formed in an active region may be provided. Interfaces between the active region and the strain-inducing pattern may have {111} surface. The interfaces may be formed at a uniform distance from a gate electrode.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device, comprising:
   an active region formed in a substrate and having an upper surface, a first side surface, a second side surface opposite the first side surface, and a third side surface in contact with the first and second side surfaces;
   a gate electrode covering at least one of the upper surface, the first side surface, and the second side surface; and
   a strain-inducing pattern in contact with the third side surface of the active region,
   wherein the third surface of the active region includes two or more planes of which a first plane forms an acute angle with respect to the first side surface, and a second plane forms an acute angle with respect to the second side surface.

2. The semiconductor device of claim 1, wherein each of the first and second planes of the active region is perpendicular to the upper surface.

3. The semiconductor device of claim 1, wherein a first edge at which the first and second planes of the active region meet, is perpendicular to the upper surface.

4. The semiconductor device of claim 3, wherein the first edge is overlapped by the gate electrode.

5. The semiconductor device of claim 3, wherein the upper surface of the active region has {110} surface, each of the first and second side surfaces has {100} surface, and each of the first and second planes has {111} surface.

6. The semiconductor device of claim 5, wherein the third side surface of the active region includes a third plane in contact with upper ends of the first and second planes and in contact with the upper surface, wherein the third plane forms an acute angle with respect to the upper surface.

7. The semiconductor device of claim 6, wherein the third plane has {111} surface.

8. The semiconductor device of claim 6, wherein an interface between the active region and the strain-inducing pattern has a trapezoidal shape in a cross-sectional view.

9. The semiconductor device of claim 1, wherein the first and second planes of the active region have a V-shape in a top view.

10. The semiconductor device of claim 1, wherein the third side surface of the active region comprises,
a third plane in contact with upper ends of the first and second planes and in contact with the upper surface; and
a fourth plane in contact with lower ends of the first and second planes,
wherein the third plane forms an acute angle with respect to the upper surface.

11. The semiconductor device of claim 10, wherein each of the upper surface, first side surface, and second side surface of the active region has {110} surface, and each of the first plane, the second plane, the third plane, and the fourth plane has {111} surface.

12. The semiconductor device of claim 10, wherein the first plane, the second plane, the third plane, and the fourth plane meet at a first corner point.

13. The semiconductor device of claim 10, further comprising:
a second corner point at which the first plane, second plane, and third plane of the active region meet;
a second edge at which the first plane and the second plane meet; and
a third corner point at which the first plane, the second plane, and the fourth plane meet,
wherein the second corner point, the second edge, and the third corner point are aligned perpendicular to the upper surface of the active region.

14. The semiconductor device of claim 10, further comprising:
a fourth corner point at which the first plane, third plane, and fourth plane of the active region meet;
a third edge at which the third plane and the fourth plane meet; and
a fifth corner point at which the second plane, the third plane, and the fourth plane meet,
wherein the fourth corner point, the third edge, and the fifth corner point are aligned parallel to the upper surface of the active region.

15. The semiconductor device of claim 1, wherein the third side surface of the active region comprises,
a fifth plane in contact with the first side surface and in contact with a lower end of the first plane; and
a sixth plane in contact with the second side surface and in contact with a lower end of the second plane,
wherein the first plane is in contact with the first side surface and the upper surface, and forms an acute angle with respect to each of the first side surface and the upper surface,
the second plane is in contact with the second side surface and the upper surface, and forms an acute angle with respect to each of the second side surface and the upper surface, the fifth plane forms an acute angle with respect to the first side surface,
the sixth plane forms an acute angle with respect to the second side surface, and
the first plane, the second plane, the fifth plane, and the sixth plane meet to form a sixth corner point.

16. The semiconductor device of claim 15, wherein each of the upper surface, first side surface, and second side surface of the active region has {100} surface, and each of the first plane, the second plane, the fifth plane, and the sixth plane has {111} surface.

17. The semiconductor device of claim 1, wherein the gate electrode covers the first and second side surfaces of the active region.

18. A semiconductor device, comprising:
a pair of strain-inducing patterns formed in a substrate;
an active region formed between the pair of strain-inducing patterns, and having a first side surface and a second side surface opposite the first side surface; and
a gate electrode crossing the active region and covering the first and second side surfaces,
wherein each of interfaces between the active region and the pair of strain-inducing patterns includes two or more planes of which a first plane forms an acute angle with respect to the first side surface, and a second plane forms an acute angle with respect to the second side surface.

19. The semiconductor device of claim 18, further comprising:
an insulating pattern formed between an upper surface of the active region and the gate electrode; and
a gate dielectric layer formed between the active region and the gate electrode.

20. A semiconductor device, comprising:
an active region having a fin portion providing a channel region between opposing source and drain regions;
a gate electrode crossing over the channel region between the opposing source and drain regions; and
first and second strain inducing structures on opposing sides of the gate electrode configured to induce strain on the channel region, each of the first and second strain inducing structures including a respective facing side having a pair of {111} crystallographically oriented facets.

21. The device of claim 20 wherein each pair of the facets is directly adjacent to opposing side surfaces of the respective strain inducing structure.

22. The device of claim 21 wherein the pair of facets define respective obtuse angles relative to the opposing side surfaces of the respective strain inducing structure.

23. The device of claim 20 wherein each of the facets obliquely faces opposing interior side walls of the gate electrode crossing over the channel region.

24. The device of claim 23 further comprising:
an oxide layer formed on the opposing interior side walls of the gate electrode crossing over the channel region; and
an insulating layer on an upper interior side wall of the gate electrode crossing over the channel region.

25. The device of claim 20 wherein the pair of {111} crystallographically oriented facets comprises a first pair of facets, wherein the strain inducing structures each include a second pair of facets on a lower surface of the strain inducing structures, wherein each of the second pair of the facets is directly adjacent to the opposing side surfaces of the respective strain inducing structure and directly adjacent to lower surfaces of the respective strain inducing structures.

26. The device of claim 25 further comprising:
a third pair of facets on an upper surface of the strain inducing structure, wherein each of the third pair of the facets is directly adjacent to the opposing side surfaces of the respective strain inducing structure and to upper surfaces of the respective strain inducing structures.

27. The device of claim 26 wherein at least a portion of each of the strain inducing structures extends beneath the gate electrode.

28. The device of claim 20 wherein the pairs of {111} crystallographically oriented facets are included in a pyramid tip shaped surface of the first and second strain inducing structures.

29. The device of claim 28 wherein the pyramid tip shaped surface includes a crest line.

30. The device of claim 20 wherein the pairs of {111} crystallographically oriented facets are included in a Chrysler building tip shaped surface of the first and second strain inducing structures each including 4 directly adjoining facets.

\* \* \* \* \*